United States Patent
Yokoyama et al.

(10) Patent No.: US 11,264,318 B2
(45) Date of Patent: Mar. 1, 2022

(54) SEMICONDUCTOR DEVICE, METHOD FOR MANUFACTURING THE SAME, AND SEMICONDUCTOR MODULE

(71) Applicant: Mitsubishi Electric Corporation, Chiyoda-ku (JP)

(72) Inventors: Yoshinori Yokoyama, Chiyoda-ku (JP); Jun Fujita, Chiyoda-ku (JP); Toshiaki Shinohara, Chiyoda-ku (JP); Hiroshi Kobayashi, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 266 days.

(21) Appl. No.: 16/479,747

(22) PCT Filed: Jan. 15, 2018

(86) PCT No.: PCT/JP2018/000848
§ 371 (c)(1),
(2) Date: Jul. 22, 2019

(87) PCT Pub. No.: WO2018/163599
PCT Pub. Date: Sep. 13, 2018

(65) Prior Publication Data
US 2021/0296226 A1  Sep. 23, 2021

(30) Foreign Application Priority Data

Mar. 8, 2017 (JP) .............................. JP2017-043893

(51) Int. Cl.
*H01L 23/52* (2006.01)
*H01L 23/31* (2006.01)
(Continued)

(52) U.S. Cl.
CPC ............. *H01L 23/52* (2013.01); *H01L 23/31* (2013.01); *H01L 23/36* (2013.01); *H01L 23/4334* (2013.01)

(58) Field of Classification Search
CPC ..... H01L 23/31; H01L 23/36; H01L 23/4334; H01L 23/52
See application file for complete search history.

(56) References Cited

U.S. PATENT DOCUMENTS 4,388,635 A   6/1983 Watanabe et al.
6,809,348 B1  10/2004 Suzuki et al.
(Continued)

FOREIGN PATENT DOCUMENTS

EP   1 115 151 A1   7/2001
JP   54-126577      9/1979
(Continued)

OTHER PUBLICATIONS

International Search Report dated Apr. 3, 2018 in PCT/JP2018/000848 filed on Jan. 15, 2018.
(Continued)

*Primary Examiner* — Allan R Wilson
(74) *Attorney, Agent, or Firm* — Xsensus LLP

(57) ABSTRACT

Provided is a semiconductor device free from chipping of a thin semiconductor element during transportation. The semiconductor device includes: a thin semiconductor element including a front-side electrode on the front side of the semiconductor element, and including a back-side electrode on the back side of the semiconductor element; a metallic member formed on at least one of the front-side electrode and the back-side electrode, the metallic member having a thickness equal to or greater than the thickness of the semiconductor element; and a resin member in contact with the lateral side of the metallic member and surrounding the
(Continued)

periphery of the metallic member, with a part of the front side of the semiconductor element being exposed.

20 Claims, 13 Drawing Sheets

(51) Int. Cl.
 *H01L 23/36* (2006.01)
 *H01L 23/433* (2006.01)

(56) References Cited

U.S. PATENT DOCUMENTS

| | | | | |
|---|---|---|---|---|
| 8,604,610 | B1* | 12/2013 | Hughes | H01L 23/49531 257/724 |
| 8,963,315 | B2 | 2/2015 | Fukuoka et al. | |
| 2007/0267724 | A1* | 11/2007 | Jeng | H01L 21/304 257/632 |
| 2009/0215230 | A1* | 8/2009 | Muto | H01L 23/49562 438/124 |
| 2010/0133666 | A1* | 6/2010 | Meyer-Berg | H01L 24/35 257/666 |
| 2011/0037166 | A1 | 2/2011 | Ikeda et al. | |
| 2011/0186981 | A1 | 8/2011 | Fukuoka et al. | |
| 2011/0298088 | A1 | 12/2011 | Elian et al. | |
| 2013/0037954 | A1 | 2/2013 | Hille et al. | |
| 2013/0241040 | A1 | 9/2013 | Tojo et al. | |
| 2014/0327071 | A1 | 11/2014 | Fuergut et al. | |
| 2017/0053871 | A1 | 2/2017 | Nakajima et al. | |

FOREIGN PATENT DOCUMENTS

| | | |
|---|---|---|
| JP | 54-177272 | 12/1979 |
| JP | 56-124265 A | 9/1981 |
| JP | 9-298211 A | 11/1997 |
| JP | 2000-58717 A | 2/2000 |
| JP | 2001-352066 A | 12/2001 |
| JP | 5126278 B2 | 11/2012 |
| JP | 2013-219324 A | 10/2013 |
| JP | 2015-220382 A | 12/2015 |
| JP | 2017-41514 A | 2/2017 |

OTHER PUBLICATIONS

Office Action dated Oct. 29, 2019 in Japanese Patent Application No. 2019-014511, (with unedited computer generated English translation) citing documents AO and AP therein, 10 pages.

German Office Action dated Sep. 27, 2021, in corresponding German Patent Application No. 11 2018 001 239.5.

* cited by examiner

SEMICONDUCTOR DEVICE, METHOD FOR MANUFACTURING THE SAME, AND SEMICONDUCTOR MODULE

TECHNICAL FIELD

The present invention relates to a structure of a semiconductor device, a method for manufacturing the same, and a semiconductor module using the semiconductor device.

BACKGROUND ART

A conventional semiconductor device is disclosed in which a semiconductor element has electrodes on both sides thereof and is sealed with resin in such a manner that the resin surrounds the peripheries of the semiconductor element and the electrodes, with the electrodes on both sides of the semiconductor element being exposed (for example, PTL 1). Electrically conductive radiator plates are provided in direct contact with the surfaces of the electrodes on both sides of the semiconductor element under pressure, so that the sides can be cooled.

CITATION LIST

Patent Literature

PTL 1: Japanese Patent No. 5126278 (page 32, FIG. 1)

SUMMARY OF INVENTION

Technical Problem

However, in the conventional semiconductor device, since the edge (periphery) of the thin semiconductor element is directly supported by the resin, an undesired force may be applied to the semiconductor element during transportation, thus causing chipping of the semiconductor element.

The present invention has been made to solve such a problem and aims to provide a semiconductor device free from chipping of a thin semiconductor element during transportation.

Solution to Problem

A semiconductor device according to the present invention is a semiconductor device comprising: a thin semiconductor element including a front-side electrode on the front side of the semiconductor element, and including a back-side electrode on the back side of the semiconductor element; a metallic member formed on at least one of the front side of the front-side electrode and the back side of the back-side electrode, the metallic member having a thickness equal to or greater than the thickness of the semiconductor element; and a resin member in contact with the lateral side of the metallic member and surrounding the periphery of the metallic member, with a part of the front side of the semiconductor element being exposed.

Advantageous Effects of Invention

According to the present invention, the metallic member and resin member can prevent the thin semiconductor element from being subjected to direct load when the semiconductor element is handled. Therefore, chipping of the thin semiconductor element can be prevented.

DESCRIPTION OF EMBODIMENTS

First, general configurations of semiconductor devices of the present invention are described with reference to the drawings. The drawings are schematical diagrams, and do not reflect the exact sizes of the components. Identically denoted components are identical or corresponding components, which is common to the entire description.

Further, when a material such as copper or aluminium is mentioned, the material includes a copper alloy or aluminium alloy possibly containing other additives, unless otherwise noted.

Embodiment 1

Figure 1:
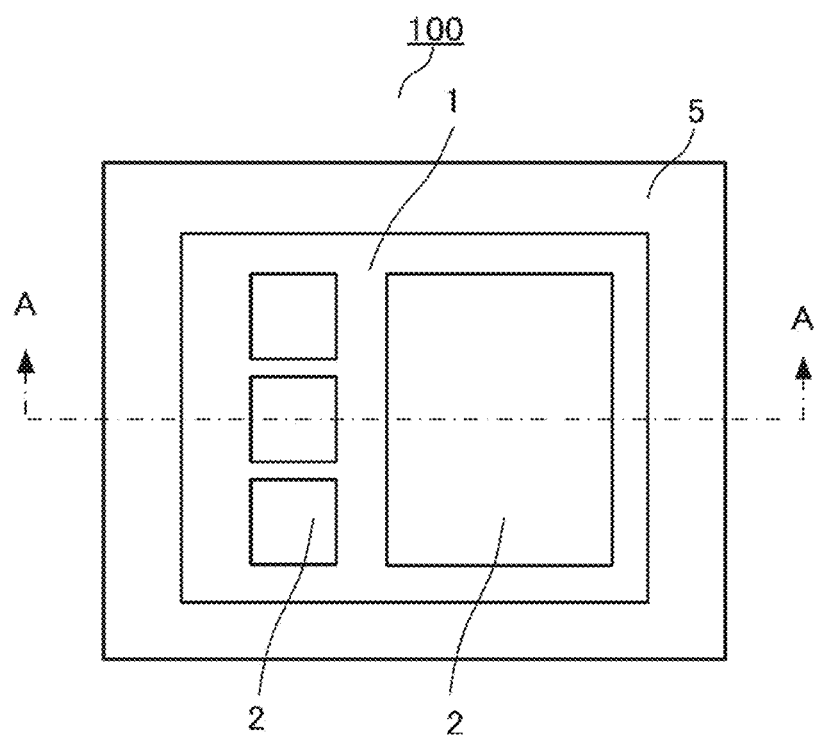
FIG. 1 is a plan structure schematic diagram showing a semiconductor device in embodiment 1 of the present invention.
Figure 2:
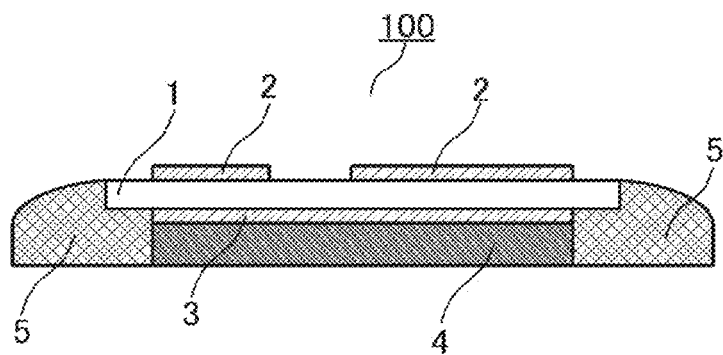
FIG. 2 is a cross-sectional structure schematic diagram showing a semiconductor device in embodiment 1 of the present invention.
Figure 3:
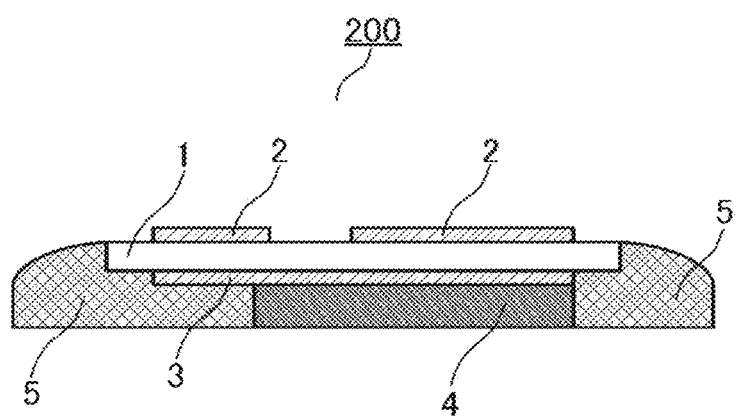
FIG. 3 is a cross-sectional structure schematic diagram showing another semiconductor device in embodiment 1 of the present invention.

FIG. 1 is a plan structure schematic diagram showing a semiconductor device in embodiment 1 of the present invention. FIG. 2 is a cross-sectional structure schematic diagram of a semiconductor device in embodiment 1 of the present invention. FIG. 3 is a cross-sectional structure schematic diagram of another semiconductor device in embodiment 1 of the present invention. A cross-sectional structure schematic diagram taken along dot-and-dash line AA in FIG. 1 is FIG. 2. In the drawings, a semiconductor device 100 includes a semiconductor element 1, a front-side electrode 2, a back-side electrode 3, a thick-film electrode 4 (metallic member), and a resin member 5. Similarly, a semiconductor device 200 includes semiconductor element 1, front-side electrode 2, back-side electrode 3, thick-film electrode 4 (metallic member), and resin member 5.

In semiconductor device 100, thick-film electrode 4 is the same size as back-side electrode 3. Specifically, thick-film electrode 4 has the same external shape as back-side electrode 3. Semiconductor device 200 is different from semiconductor device 100 in the size of thick-film electrode 4. In Semiconductor device 200, thick-film electrode 4 is smaller in size than back-side electrode 3. Specifically, thick-film electrode 4 is smaller in external shape than back-side electrode 3.

Semiconductor element 1 includes front-side electrode 2 on the front side, and includes back-side electrode 3 on the back side, opposite to the front side. Thick-film electrode (back-side thick-film electrode) 4 is formed on the back side of back-side electrode 3, which is the side (face) opposite to the front side of back-side electrode 3 joined to the back side of semiconductor element 1. Thus, the front side of thick-film electrode 4 faces and is in contact with the back side of back-side electrode 3. Semiconductor element 1 is a power semiconductor element, such as an insulated gate bipolar transistor (IGBT). Semiconductor element 1 has electrodes (front-side electrode 2, back-side electrode 3) on both sides (front and back sides) of semiconductor element 1.

Front-side electrode 2 is divided into four in FIG. 1. However, the number of divisions is not limited to four, but front-side electrode 2 may be divided into any number more than one. A part of the front side of semiconductor element 1 is exposed, with no front-side electrode 2 thereon. Although shown as a single piece in FIGS. 2 and 3, back-side electrode 3 is not limited to a single piece but may be divided into two or more pieces.

Front-side electrode 2 or back-side electrode 3 may be made of aluminium or copper, for example. An electrode material and a material constitution typically used for manufacturing semiconductor element 1 can be used to produce front-side electrode 2 and back-side electrode 3.

The side of back-side electrode 3 that is joined to the front side of thick-film electrode 4 (i.e., the back side of back-side electrode 3) should be made of a material appropriately selected according to the joint material. For example, if solder is used as a joint material for joining, the joint portion of the back side of back-side electrode 3 is preferably made of, for example, copper or nickel. If the joint material is a low-temperature sintered material of silver or copper nanoparticles, the joint portion of the back side of back-side electrode 3 is preferably made of silver, copper, or gold, for example.

The joint portion of the back side of back-side electrode 3 may be produced by depositing a material by sputtering, vacuum evaporation, plating, or the like. For example, if back-side electrode 3 is made of aluminium and is joined to the front side of thick-film electrode 4 via solder as a joint material, the joint portion of the back side of back-side electrode 3 should be plated with, for example, nickel.

Thick-film electrode 4 may be formed by plating with copper, nickel, or the like. Thick-film electrode 4 may be formed by sintering copper or silver nanoparticles or the like. Further, thick-film electrode 4 may be formed using a foil or thin plate, by direct joining or solder joining, by copper-tin liquid phase diffusion bonding, or by joining with a low-temperature sintered material of silver or copper nanoparticles. Thick-film electrode 4 may be a thick metallic plate (metallic block) that is applicable as thick-film electrode 4. Further, the corners of thick-film electrode 4 may have a curvature (round shape) to prevent a stress concentration.

Thick-film electrode 4 is preferably made of a material having a high electrical conductivity and having a high thermal conductivity for cooling the power semiconductor element. For example, thick-film electrode 4 may be made of copper, silver, or aluminium, for example. The joint portion of the front side of thick-film electrode 4 is formed by depositing a material by sputtering, vacuum evaporation, plating, or the like, depending on the joint material for joining with the back side of back-side electrode 3.

As shown in FIG. 2, thick-film electrode 4 has a thickness of equal to or greater than the thickness of thin semiconductor element 1. Thin semiconductor element 1 refers to semiconductor element 1 whose thickness has been reduced by a thinning process. The thickness of thin semiconductor element 1 may be selected as appropriate in accordance with electrical characteristics, for example. The thickness of thin semiconductor element 1 may be reduced to, for example, about 200 µm or less, and is preferably not less than 30 µm and not more than 150 µm. As to the thickness of thick-film electrode 4 joined to the back side of back-side electrode 3, thick-film electrode 4 lower in flexural rigidity than semiconductor element 1 would not compensate for the thinness of semiconductor element 1 very much, and thus would not be able to prevent chipping of semiconductor element 1 very effectively. Accordingly, thick-film electrode 4 requires a thickness such that the flexural rigidity of thick-film electrode 4 is equal to or greater than the flexural rigidity of semiconductor element 1 on which thick-film electrode 4 is formed. Generally, the flexural rigidity is calculated by (Young's modulus)×(second moment of area)/(length). If a semiconductor element has a rectangular section as with semiconductor element 1, the second moment of area is proportional to the width of the semiconductor element and proportional to the cube of the thickness of the semiconductor element. For example, if semiconductor element 1 is a Si element having a Young's modulus of 160 GPa and having a thickness of 50 µm, and if thick-film electrode 4 is an aluminium electrode having a Young's modulus of 70 GPa, the thick-film electrode requires a thickness of 66 µm or more. If semiconductor element 1 is a SiC element having a Young's modulus of 430 GPa and having a thickness of 100 µm, and if thick-film electrode 4 is a copper electrode having a Young's modulus of 110 GPa, the thick-film electrode requires a thickness of 158 µm or more. Thus, if the thickness of semiconductor element 1 is within the above-described range, the thickness of thick-film electrode 4 may be about not less than 30 µm and not more than 500 µm. The thickness of thick-film electrode 4 can be selected as appropriate in accordance with the thickness of semiconductor element 1.

As shown in FIG. 2, thick-film electrode 4 has substantially the same size (area) as back-side electrode 3. Back-side electrode 3 is smaller in size than semiconductor element 1. However, back-side electrode 3 may be formed on substantially the entire back side of semiconductor element 1. As to the size of thick-film electrode 4, as with semiconductor device 200 shown in FIG. 3, thick-film electrode 4 does not necessarily have to cover the entire back side of back-side electrode 3, but has only to be larger in area than the heat generation portion of semiconductor element 1. In this case, a part of the back side of back-side electrode 3 where no thick-film electrode 4 is formed (i.e., exposed part) is covered with resin member 5. Note, however, that the contact (joint) area between thick-film electrode 4 and back-side electrode 3 is greater (larger) in semiconductor device 100 in FIG. 2 than in semiconductor device 200 in FIG. 3. Therefore, semiconductor device 100 can better diffuse the heat generated at semiconductor element 1 through thick-film electrode 4, and thus more effectively reduce the thermal resistance than semiconductor device 200. As to the shape of thick-film electrode 4, the corners of thick-film electrode 4 may have a curvature (round shape) to prevent a stress concentration.

Resin member 5 is in contact with the lateral side of thick-film electrode 4 and surrounds the periphery of thick-film electrode 4. As shown in FIG. 1, resin member 5 surrounds the entire periphery of semiconductor element 1. As shown in FIG. 2, resin member 5 is in contact with the lateral sides of back-side electrode 3 and semiconductor element 1, and surrounds the peripheries of back-side electrode 3 and semiconductor element 1. Resin member 5 is also formed at a region (outer periphery portion) of the back side of semiconductor element 1 where no back-side electrode 3 is formed. Resin member 5 is disposed in such a manner that the entire front side of front-side electrode 2, opposite to the back side of front-side electrode 2 joined to the front side of semiconductor element 1, is exposed; and in such a manner that the entire back side of thick-film electrode 4, opposite to the front side of thick-film electrode 4 joined to the back side of back-side electrode 3, is exposed. That is, resin member 5 has an exposure region to allow electrical connection of front-side electrode 2 and thick-film electrode 4. The front side of semiconductor element 1 includes an exposed region that is not covered with resin member 5. The exposed region of the front side of semiconductor element 1 limits a region sealed with resin member 5, and allows reliable electrical connection of the front side of front-side electrode 2.

In semiconductor devices 100, 200 having the above-described configuration, thick-film electrode 4 provided on the back side of back-side electrode 3 compensates for the thinness of semiconductor element 1 and thus can reduce the load on semiconductor element 1. In semiconductor devices 100, 200, resin member 5 covering the peripheries of thick-film electrode 4 and semiconductor element 1 can protect the outer periphery portion of semiconductor element 1, thus preventing chipping, cracking, and other damage of semiconductor element 1 during transportation (handling) of semiconductor element 1. Further, unlike a conventional semiconductor element 1 having only resin member 5, semiconductor devices 100, 200 can prevent direct load on semiconductor element 1. Thus, semiconductor devices 100, 200 can reduce the load on semiconductor element 1 during, for example, transportation.

Next, a method for manufacturing a semiconductor device in embodiment 1 is described.

Figure 4:
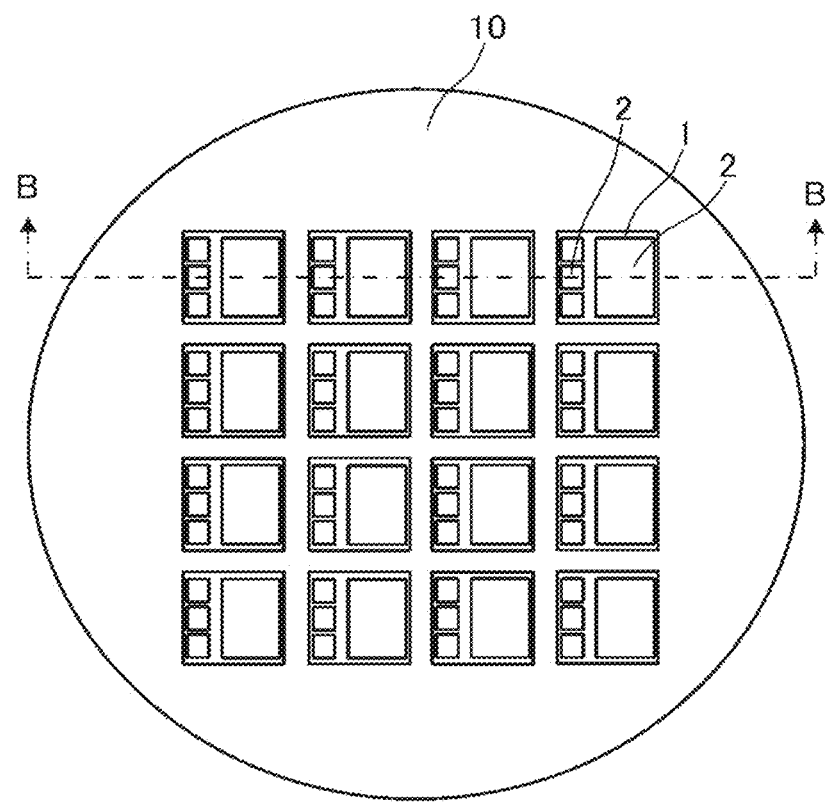
FIG. 4 is a plan structure schematic diagram showing a manufacturing step for a semiconductor device in embodiment 1 of the present invention.
Figure 5:
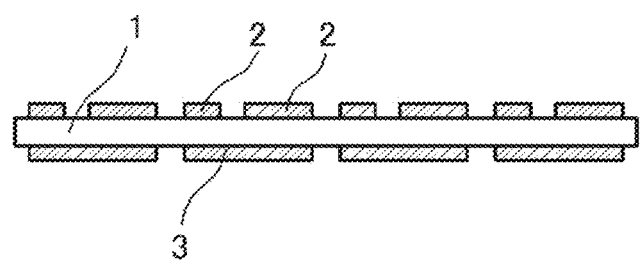
FIG. 5 is a cross-sectional structure schematic diagram showing a manufacturing step for a semiconductor device in embodiment 1 of the present invention.
Figure 6:
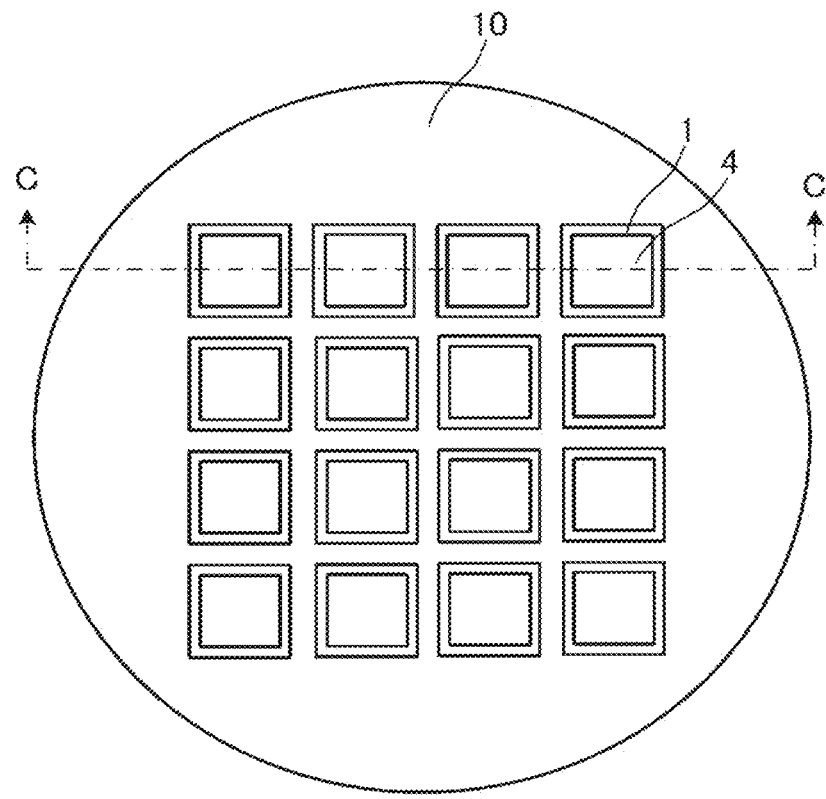
FIG. 6 is a plan structure schematic diagram showing a manufacturing step for a semiconductor device in embodiment 1 of the present invention.
Figure 7:
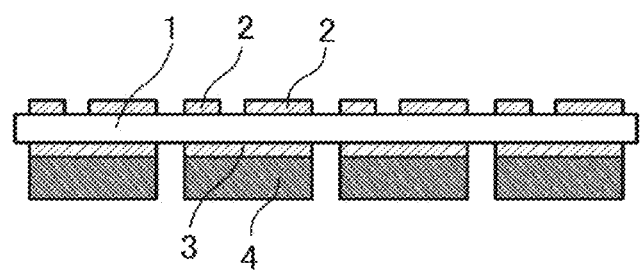
FIG. 7 is a cross-sectional structure schematic diagram showing a manufacturing step for a semiconductor device in embodiment 1 of the present invention.
Figure 8:
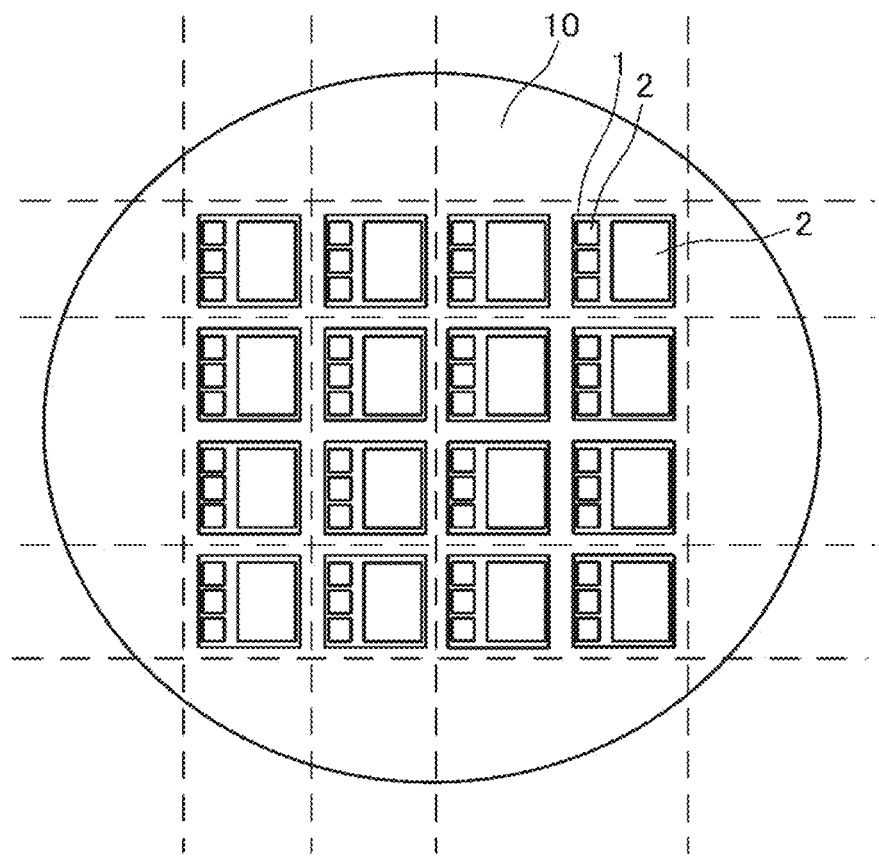
FIG. 8 is a plan structure schematic diagram showing a manufacturing step for a semiconductor device in embodiment 1 of the present invention.
Figure 9:
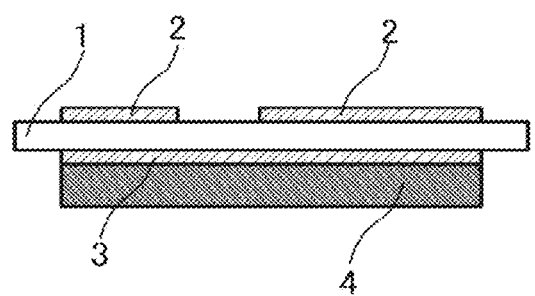
FIG. 9 is a cross-sectional structure schematic diagram showing a manufacturing step for a semiconductor device in embodiment 1 of the present invention.
Figure 10:
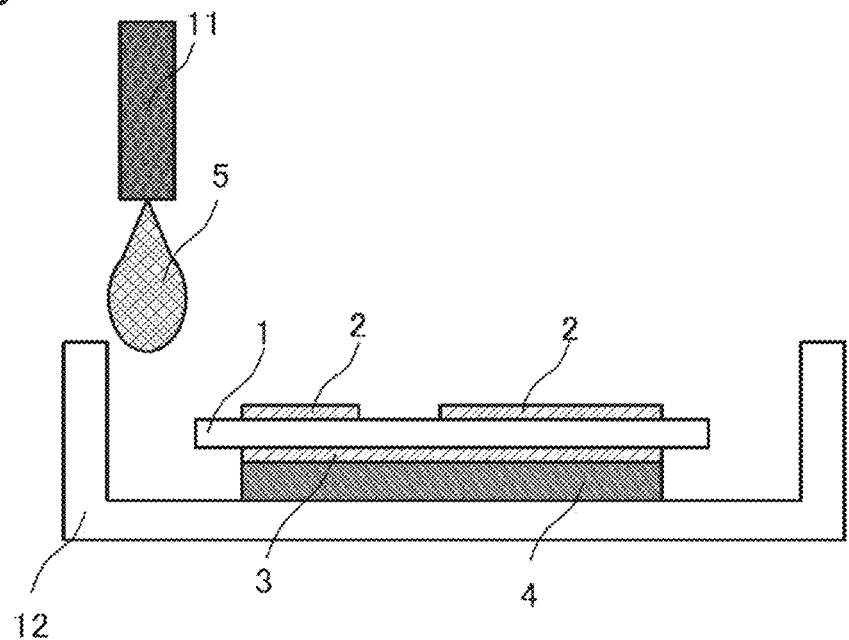
FIG. 10 is a cross-sectional structure schematic diagram showing a manufacturing step for a semiconductor device in embodiment 1 of the present invention.
Figure 11:
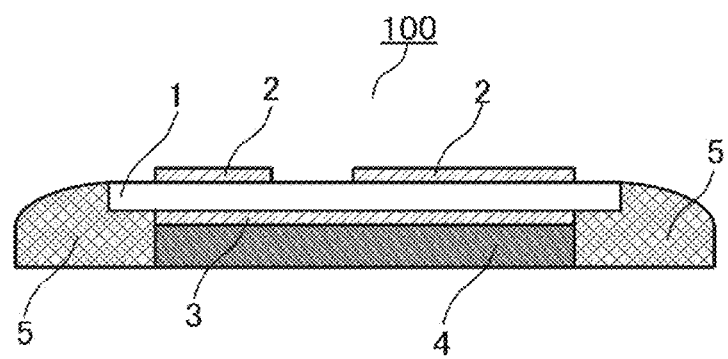
FIG. 11 is a cross-sectional structure schematic diagram showing a semiconductor device in embodiment 1 of the present invention.

FIGS. 4 to 11 are cross-sectional structure schematic diagrams showing manufacturing steps for a semiconductor device in embodiment 1 of the present invention. FIG. 4 is a plan structure schematic diagram showing a manufacturing step for a semiconductor device in embodiment 1 of the present invention. FIG. 5 is a cross-sectional structure schematic diagram showing a manufacturing step for a semiconductor device in embodiment 1 of the present invention. FIG. 6 is a plan structure schematic diagram showing a manufacturing step for a semiconductor device in embodiment 1 of the present invention. FIG. 7 is a cross-sectional structure schematic diagram showing a manufacturing step for a semiconductor device in embodiment 1 of the present invention. FIG. 8 is a plan structure schematic diagram showing a manufacturing step for a semiconductor device in embodiment 1 of the present invention. FIG. 9 is a cross-sectional structure schematic diagram showing a manufacturing step for a semiconductor device in embodiment 1 of the present invention. FIG. 10 is a cross-sectional structure schematic diagram showing a manufacturing step for a semiconductor device in embodiment 1 of the present invention. FIG. 11 is a cross-sectional structure schematic diagram showing a manufacturing step for a semiconductor device in embodiment 1 of the present invention.

First, as shown in FIG. 4, at a predetermined region of a semiconductor wafer 10 on which a predetermined process has been performed (i.e., a region which will be made into semiconductor element 1), front-side electrode 2 is formed on the front side, and back-side electrode 3 is formed on the back side (electrode formation step). A typical method can be used to form front-side electrode 2 and back-side electrode 3. For example, a metallic material selected as front-side electrode 2 and back-side electrode 3 is deposited at a predetermined position on semiconductor element 1 by vacuum evaporation, sputtering, or the like. A cross-sectional structure schematic diagram taken along dot-and-dash line BB in FIG. 4 is FIG. 5. A thinning process may be performed on semiconductor wafer 10 before forming front-side electrode 2 and back-side electrode 3. The thinning process may be performed on the back side of semiconductor wafer 10 after forming front-side electrode 2 and before forming back-side electrode 3. An appropriate thinning process on semiconductor wafer 10 (semiconductor element 1) can be selected as appropriate in accordance with the manufacturing step.

Next, as shown in FIG. 6, thick-film electrode 4 (metallic member) is formed on the back side of back-side electrode 3 (metallic member formation step). As described above, thick-film electrode 4 may be formed by joining a metallic plate (metallic block) having a predetermined thickness via a joint material or by deposition onto back-side electrode 3, such as sputtering or plating. A cross-sectional structure schematic diagram taken along dot-and-dash line CC in FIG. 6 is FIG. 7 (in FIG. 7, the front and back sides are inverted). The manufacturing steps up to here are performed on semiconductor wafer 10, from which a plurality of semiconductor elements 1 can be formed at the same time. Although thick-film electrode 4 is formed on the back side of back-side electrode 3 in this step, a thick-film electrode may be formed on the front side of front-side electrode 2. The thick-film electrode can be formed in the same way as thick-film electrode 4. FIG. 6 is a plan structure schematic diagram on the back side of semiconductor wafer 10.

Next, as shown in FIG. 8, after semiconductor elements 1 are formed, the wafer is cut into individual semiconductor elements 1 having a predetermined size in accordance with, for example, the electric current density (semiconductor element cutting step). Dicing may be used for cutting into individual semiconductor elements 1. Each individual semiconductor element 1 has a cross-sectional shape as shown in FIG. 9. FIG. 9 shows a case in which thick-film electrode 4 is formed on the back side of back-side electrode 3 before cutting into individual semiconductor elements 1. Alternatively, thick-film electrode 4 may be formed on the back side of back-side electrode 3 after cutting into individual semiconductor elements 1.

Next, individual semiconductor element 1 is covered with resin.

As shown in FIG. 10, individual semiconductor element 1 is placed in a case 12, with the back side of thick-film electrode 4 facing downward. Then, resin member 5 is injected from a nozzle 11 into case 12 by potting, in such a manner that resin member 5 does not cover front-side electrode 2. Thus, the periphery of semiconductor element 1 is covered with resin member 5 (resin member application step). Although FIG. 10 shows a single semiconductor element 1, a plurality of semiconductor elements 1 may be processed at the same time in case 12.

Instead of the above-described potting, a molding die may also be used to cover the periphery of semiconductor element 1 with resin member 5. In a method using a molding die, semiconductor element 1 is placed in a molding die, and resin member 5 is injected under pressure. When such a molding die is used, a portion of semiconductor element 1 that will be exposed through resin member 5 after resin member 5 is formed may be in tight contact with the inner side of the molding die, so that resin member 5 will not be applied to the portion. Alternatively, resin member 5 may be formed by masking a portion of thick-film electrode 4 that will be exposed.

When the potting with resin member 5 is performed, semiconductor element 1 may be processed in the potting case. Any case (container) may be used that allows processes with easy molding of resin member 5. A case (container) can be selected as appropriate depending on resin member 5 to be used.

Through these steps, the periphery of semiconductor element 1 with the electrodes formed thereon is covered (surrounded) with resin member 5, and thus semiconductor device 100 as shown in FIG. 11 can be formed.

As another manufacturing method, individual semiconductor element 1 can be placed on a protective sheet so that the front side of front-side electrode 2 is in contact with the protective sheet (semiconductor element placement step).

Figure 12:
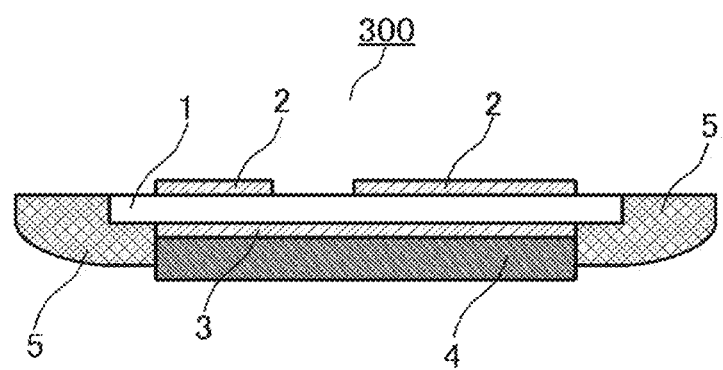
FIG. 12 is a cross-sectional structure schematic diagram showing another semiconductor device in embodiment 1 of the present invention.

FIG. 12 is a cross-sectional structure schematic diagram of another semiconductor device in embodiment 1 of the present invention. In the drawing, a semiconductor device 300 includes semiconductor element 1, front-side electrode 2, back-side electrode 3, thick-film electrode 4 (metallic member), and resin member 5. Semiconductor device 300 is different from semiconductor device 100 in its manufacturing method. In a method for manufacturing semiconductor device 300, the method of forming resin member 5 is different.

In a method for manufacturing semiconductor device 300 shown in FIG. 12, cutting into individual semiconductor elements 1 is performed, and the front side of front-side electrode 2 of each semiconductor element 1 is placed on a protective sheet, and then the periphery of semiconductor element 1 is covered with resin member 5 by, for example, the above-described potting (resin member application step). Through these steps, semiconductor device 300 having a configuration as shown in FIG. 12 can be formed. The details of a manufacturing method using a protective sheet will be described later.

In FIG. 12, resin member 5 covers the periphery of thick-film electrode 4, with a part of the lateral side of thick-film electrode 4 being exposed. Resin member 5 of semiconductor device 300 in FIG. 12 is formed from a direction different from that of FIG. 2, and is thus vertically inverted in shape from that of FIG. 2. This is due to a difference in the method of forming resin member 5, specifically, a difference in the orientation of the front side of front-side electrode 2 (upward or downward) when semiconductor element 1 is placed on a protective sheet.

For example, semiconductor device 300 can be formed by providing a groove in case 12, fitting front-side electrode 2 in the groove, and covering the periphery of semiconductor element 1 with resin member 5. At this time, resin member 5 is not formed on the lateral side of front-side electrode 2 fitted in the groove in case 12. Also, depending on the amount of supply of resin member 5, a part of the lateral side of thick-film electrode 4 is exposed with no resin member 5 thereon because the back side of thick-film electrode 4 faces upward while resin member 5 is applied. Alternatively, resin member 5 may be formed in contact with the entire lateral side of thick-film electrode 4.

Figure 13:
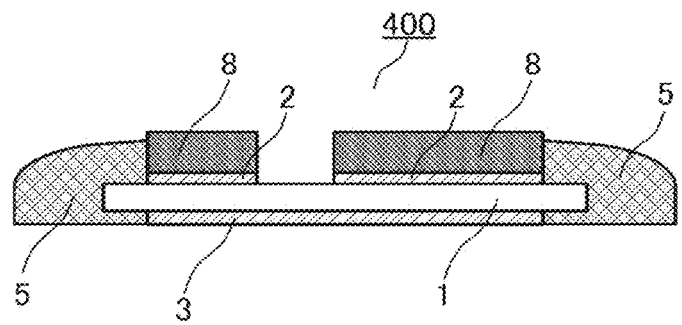
FIG. 13 is a cross-sectional structure schematic diagram showing another semiconductor device in embodiment 1 of the present invention.

FIG. 13 is a cross-sectional structure schematic diagram of another semiconductor device in embodiment 1 of the present invention. In the drawing, a semiconductor device 400 includes semiconductor element 1, front-side electrode 2, back-side electrode 3, a thick-film electrode 8 (metallic member), and resin member 5. In semiconductor device 400, thick-film electrode (front-side thick-film electrode) 8 is formed on the front side of front-side electrode 2, opposite to the back side of front-side electrode 2 formed on the front side of semiconductor element 1. Semiconductor device 400 is different from semiconductor device 100 in that the back side of thick-film electrode 8 is on the front side of front-side electrode 2. Resin member 5 is formed in contact with the lateral sides of front-side electrode 2 and thick-film electrode 8 adjacent to the outer periphery of semiconductor element 1, with the front side of thick-film electrode 8 being exposed. Further, resin member 5 covers the outer periphery portion of semiconductor element 1 protruding from the lateral side of back-side electrode 3 to the outer side. Resin member 5 is lower than the height of the front side of thick-film electrode 8, with a part of the lateral side of thick-film electrode 8 being exposed. By exposing a part of the lateral side of thick-film electrode 8, the front side of thick-film electrode 8 can be effectively utilized as an electrode.

For example, if semiconductor element 1 is an IGBT, thick-film electrode (front-side thick-film electrode) 8 may be formed on only a large one of front-side electrodes 2 (e.g. an emitter electrode) where a large current flows, or may be formed on both front-side electrodes 2 including a base where a large current does not flow.

Figure 14:
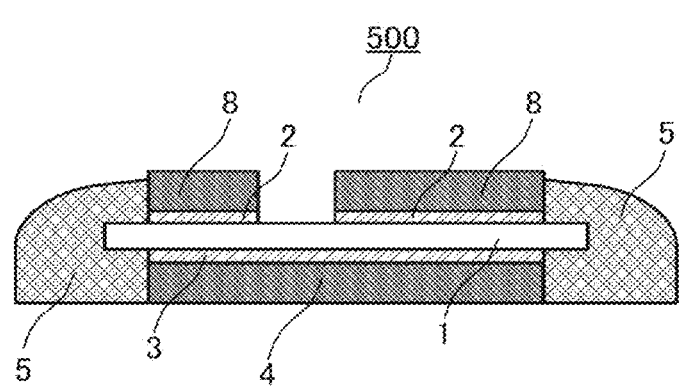
FIG. 14 is a cross-sectional structure schematic diagram showing another semiconductor device in embodiment 1 of the present invention.

FIG. 14 is a cross-sectional structure schematic diagram of a semiconductor device in embodiment 1 of the present invention. In the drawing, a semiconductor device 500 includes semiconductor element 1, front-side electrode 2, back-side electrode 3, thick-film electrodes 4, 8 (metallic members), and resin member 5.

As shown in FIG. 14, thick-film electrode 8 may be formed on the front side of front-side electrode 2, and thick-film electrode 4 may be formed on the back side of back-side electrode 3. If a plurality of front-side electrodes 2 and back-side electrodes 3 are provided, thick-film electrode 8 is basically formed on each front-side electrode 2, and thick-film electrode 4 is basically formed on each back-side electrode 3. However, it is needless to say that some front-side electrodes 2 and back-side electrodes 3 may not have thick-film electrodes 8, 4. Resin member 5 is formed so that the front side of thick-film electrode 8 on the front side of front-side electrode 2 is exposed, and so that the back side of thick-film electrode 4 on the back side of back-side electrode 3 is exposed. Resin member 5 is in contact with the lateral sides of front-side electrode 2 and back-side electrode 3 adjacent to the outer periphery of semiconductor element 1, and covers the outer periphery portion of semiconductor element 1 protruding from the lateral side of back-side electrode 3 to the outer side. Further, resin member 5 is lower than the height of the front side of thick-film electrode 8, with a part of the lateral side of thick-film electrode 8 being exposed.

The front side of front-side electrode 2 on which thick-film electrode 8 is formed can be configured and produced appropriately in accordance with the joint material for joining front-side electrode 2 and thick-film electrode 8, in the same manner as the above-described back side of back-side electrode 3 on which thick-film electrode 4 is formed. Thus, the description thereof is not repeated.

The material and thickness of thick-film electrode 8 are the same as those of thick-film electrode 4 described above, and thus the description thereof is not repeated. Thick-film electrode 4 and thick-film electrode 8 may be the same as or different from each other in material and thickness. Thick-film electrode 4 and thick-film electrode 8 may be made of any material and may have any structure that can compensate for the thinness of semiconductor element 1, that can provide electrical connection, and that can ensure a high heat radiation performance.

In order to function as an electrode, thick-film electrode 8 preferably is about the same size or smaller in size than front-side electrode 2. With thick-film electrode 8 formed on the front side of front-side electrode 2, a part of the front side of semiconductor element 1 is exposed through resin member 5, with no front-side electrode 2 thereon.

The lateral side of thick-film electrode 8 can be covered with resin member 5 similarly to thick-film electrode 4 on the back side of back-side electrode 3, and thus the description thereof is not repeated.

Thus, semiconductor device 300 has thick-film electrode 4 on the back side of back-side electrode 3; semiconductor device 400 has thick-film electrode 8 on the front side of front-side electrode 2; and semiconductor device 500 has thick-film electrode 4 on the back side of back-side electrode 3, and thick-film electrode 8 on the front side of front-side electrode 2. Accordingly, thick-film electrode 4 or thick-film electrode 8 compensates for the thinness of semiconductor element 1 and thus can reduce the load on semiconductor element 1. In semiconductor devices 300, 400, 500, resin member 5 covering the periphery of semiconductor element 1 can protect the outer periphery portion of semiconductor element 1, thus preventing chipping, cracking, and other damage of semiconductor element 1 during handling of semiconductor element 1. Further, unlike a conventional semiconductor element 1 having only resin member 5, semiconductor devices 300, 400, 500 can prevent direct load on semiconductor element 1. Thus, semiconductor devices 300, 400, 500 can reduce the load on semiconductor element 1 during, for example, handling.

Figure 15:
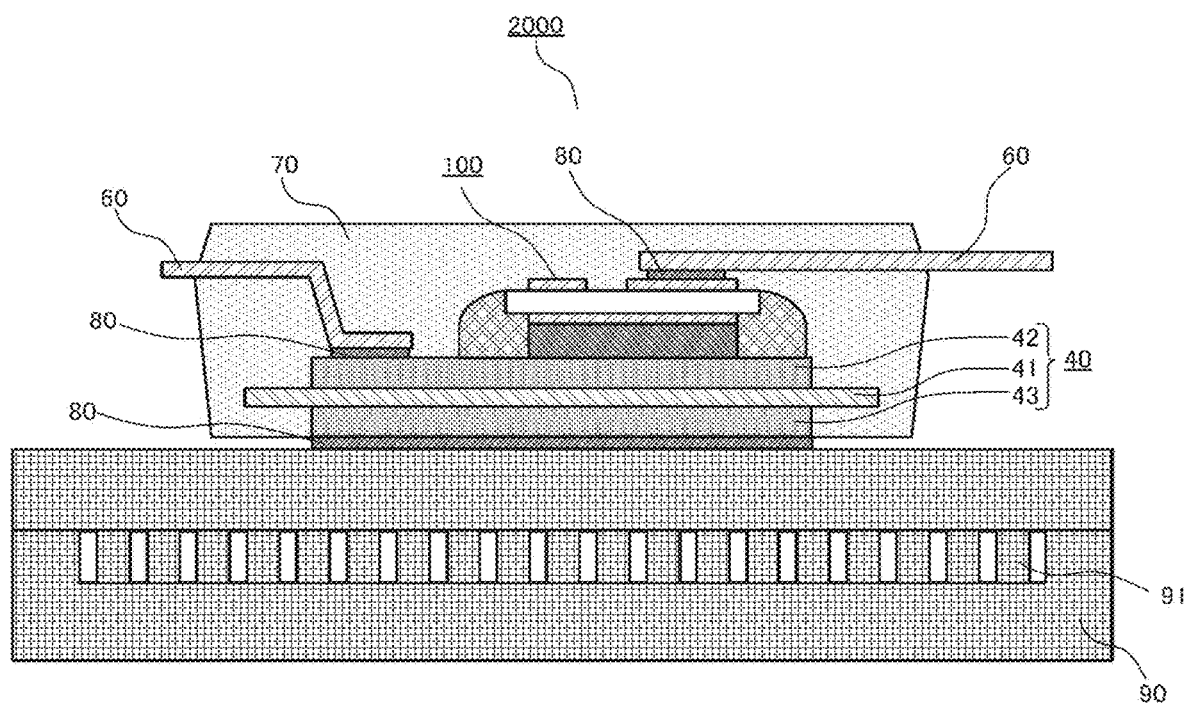
FIG. 15 is a cross-sectional structure schematic diagram showing a semiconductor module in embodiment 1 of the present invention.

FIG. 15 is a cross-sectional structure schematic diagram showing a semiconductor module in embodiment 1 of the present invention. In the drawing, semiconductor module 2000 includes semiconductor device 100, an insulating circuit substrate 40, an electrode terminal 60, a molded resin 70 (sealing member), a joint material 80, and a cooler 90.

The upper side and lower side of the semiconductor module correspond to the front side and back side of the semiconductor device, respectively.

Insulating circuit substrate 40 includes a ceramic plate 41 (insulating substrate) and conductor layers 42, 43 formed on the upper and lower sides, respectively, of ceramic plate 41. Ceramic plate 41 may be made of silicon nitride ($Si_3N_4$), aluminium nitride (AlN), alumina, or Zr-containing alumina. In particular, AlN and $Si_3N_4$ are preferable in terms of the thermal conductivity, and $Si_3N_4$ is more preferable in terms of the material strength.

Conductor layers 42, 43 formed on both sides (upper and lower sides) of ceramic plate 41 are made of a metal having the same dimensions (size) and thickness. However, conductor layers 42, 43, which have their respective electric circuits, may have different pattern shapes. Conductor layers 42, 43 are smaller in size than ceramic plate 41. Since conductor layers 42, 43 are smaller in size than ceramic plate 41, the creepage distance between conductor layers 42, 43 can be increased (kept). Further, since conductor layer 43 is smaller in size than ceramic plate 41, molded resin 70 can enter the space on the lower side of ceramic plate 41. Conductor layers 42, 43 may be made of a metal having high electrical and thermal conductivities, such as aluminium, aluminium alloy, copper, or copper alloy. In particular, copper is preferable in terms of the thermal and electrical conductivities.

On conductor layer 42 on the upper side of ceramic plate 41, semiconductor device 100 is electrically joined via solder (not shown) as joint material 80, for example. As a material constituting semiconductor device 100, silicon (Si) or silicon carbide (SiC) may be used, for example. A Si semiconductor element or SiC semiconductor element using one of these materials as a substrate material is applicable.

Solder is typically used as joint material 80 for joining semiconductor device 100 to conductor layer 42 on the upper side in insulating circuit substrate 40. Sintered silver or liquid phase diffusion material is also applicable as joint material 80, instead of solder. Sintered silver and liquid phase diffusion material, which are higher in melting temperature than solder material, do not remelt when cooler 90 is joined to conductor layer 43 on the lower side in insulating circuit substrate 40. Therefore, sintered silver and liquid phase diffusion material enhance reliability in joining between semiconductor device 100 and insulating circuit substrate 40.

Further, sintered silver and liquid phase diffusion material, which are higher in melting temperature than solder, allow a higher operating temperature of semiconductor module 2000. Sintered silver, which is higher in thermal conductivity than solder, achieves higher heat radiation performance of semiconductor device 100 and thus enhances reliability. Liquid phase diffusion material, which can provide joining with lower load than sintered silver, achieves better processibility and can prevent semiconductor device 100 from being damaged by the joining load.

Electrode terminal 60 is joined to a predetermined electrode terminal 60 joining position on semiconductor device 100. Electrode terminal 60 is also joined to predetermined electrode terminal 60 joining position on conductor layer 42 on the upper side in insulating circuit substrate 40. Electrode terminal 60 protrudes from the lateral side of molded resin 70 to the outer side. Electrode terminal 60 may be produced by, for example, processing a 0.5 mm thickness copper plate into a predetermined shape by etching, die cutting, or the like.

Molded resin 70 seals ceramic plate 41, conductor layer 42, and conductor layer 43 described above. Molded resin 70 also seals semiconductor device 100 disposed on conductor layer 42. At this time, molded resin 70 is on an exposed region of the front side of semiconductor element 1 of semiconductor device 100. Further, molded resin 70 seals a connection portion between electrode terminal 60 and conductor layer 42 and between electrode terminal 60 and semiconductor device 100, with one end of electrode terminal 60 protruding to the outside of molded resin 70. Molded resin 70 may be, for example, curable epoxy resin or phenolic resin with silica particles added.

Solder may be used as joint material 80 for joining cooler 90 to conductor layer 43 on the lower side in insulating circuit substrate 40, for example. As the solder, Sn—Sb solder material is preferable in terms of the joining reliability. Sintered silver or liquid phase diffusion material may also be used, instead of solder, to join cooler 90 to conductor layer 43 on the lower side in insulating circuit substrate 40, as with the joining between semiconductor device 100 and insulating circuit substrate 40.

As the liquid phase diffusion material, Cu—Sn material and Cu—Ag material are preferable in terms of the joining reliability. Sintered silver, which is higher in thermal conductivity than solder, achieves higher heat radiation performance of semiconductor module 2000 and thus enhances reliability. Liquid phase diffusion material, which can provide joining with lower load than sintered silver, achieves better processibility and can prevent semiconductor module 2000 from being damaged by the joining load.

Cooler 90 may be made of aluminium, aluminium alloy, copper, copper alloy, or composite material composed of aluminium and ceramics (e.g. AlSiC), for example. In particular, aluminium or aluminium alloy is preferable for its good thermal conductivity, workability, and light weight. Cooler 90 includes a flow path therein to allow coolant to flow. In FIG. 15, a plurality of cooling pins 91 are provided, thus allowing efficient cooling. Cooler 90 is not limited to this structure but may have any structure that can achieve cooling. Instead of semiconductor device 100, any of semiconductor devices 200, 300, 400, 500 and the semiconductor devices in the embodiments described below can be applied to the above-described semiconductor module 2000, as appropriate.

In a semiconductor device having the above-described configuration, thick-film electrode 4 is formed on the back side of back-side electrode 3 of semiconductor element 1, and the periphery of thick-film electrode 4 is covered with resin member 5. Accordingly, the load on semiconductor element 1 can be reduced during handling of semiconductor element 1, thus enabling easy transportation of thin semiconductor element 1.

Also, thick-film electrode 8 is formed on the front side of front-side electrode 2 of semiconductor element 1, and the periphery of thick-film electrode 8 is covered with resin member 5. Accordingly, the load on semiconductor element 1 can be reduced during handling of semiconductor element 1, thus enabling easy transportation of thin semiconductor element 1.

Further, since thick-film electrode 4 and thick-film electrode 8 are formed respectively on back-side electrode 3 and front-side electrode 2 of semiconductor element 1, the electrodes on semiconductor element 1 are increased in thickness. Accordingly, heat radiation from semiconductor element 1 is promoted, and the semiconductor device is improved in short-circuit capacity.

Further, thick-film electrodes 4, 8 are made of a sintered material of copper or silver nanoparticles, and thus have porosity peculiar to sintered material. Accordingly, thick-film electrodes 4, 8, though thick, can relax the thermal stress generated due to a difference in coefficient of linear expansion. Therefore, the load on semiconductor element 1 can be reduced.

Embodiment 2

Embodiment 2 is different from embodiment 1 in the placement of resin member 5. Specifically, in embodiment 2, resin member 5 protrudes downward from the back side of thick-film electrode 4. Resin member 5 protruding downward from the back side of thick-film electrode 4 eliminates the need for an additional member for height adjustment when the back side of thick-film electrode 4 is soldered to another member. The solder height can be adjusted in accordance with the degree of protrusion of resin member 5 from the back side of thick-film electrode 4. In the other respects, embodiment 2 is the same as embodiment 1, and thus the detailed description is not repeated.

With this configuration, thick-film electrode 4 is provided on the back side of back-side electrode 3 of semiconductor element 1, and the periphery of thick-film electrode 4 is covered with resin member 5. Accordingly, the load on semiconductor element 1 can be reduced during handling of semiconductor element 1, thus enabling easy transportation of thin semiconductor element 1.

Figure 16:
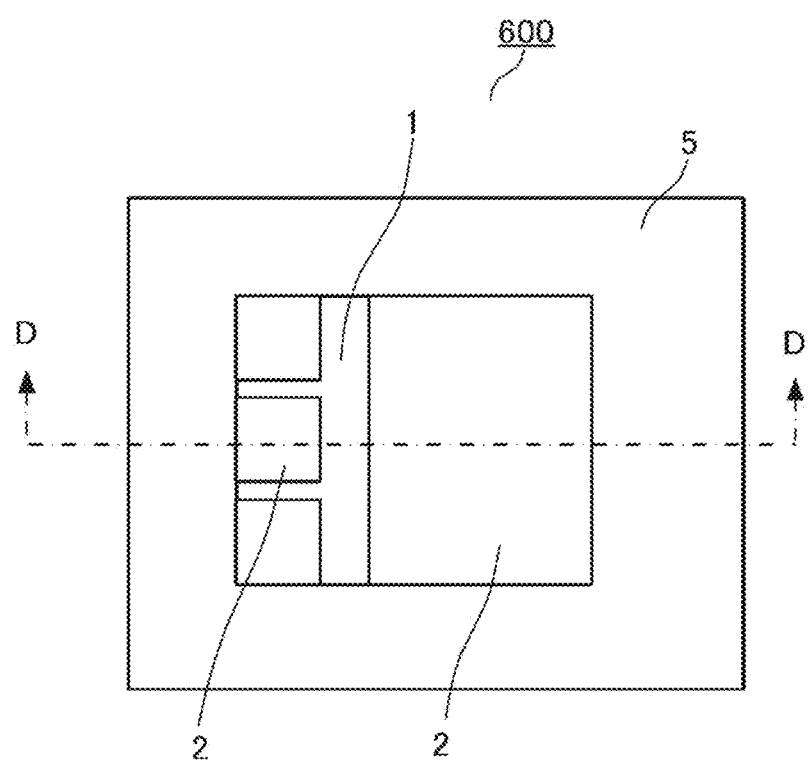
FIG. 16 is a plan structure schematic diagram showing a semiconductor device in embodiment 2 of the present invention.
Figure 17:
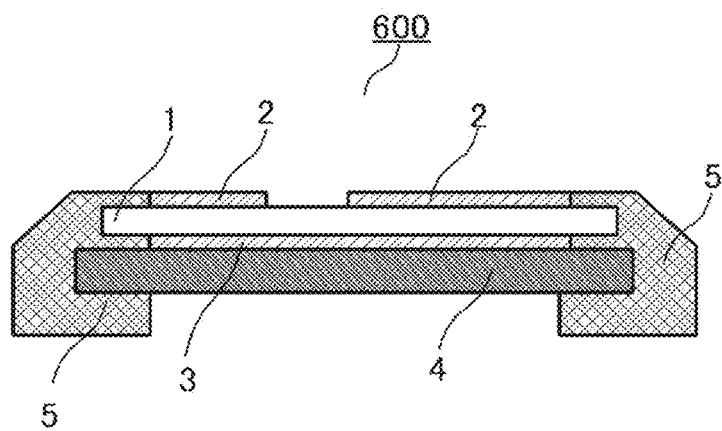
FIG. 17 is a cross-sectional structure schematic diagram showing a semiconductor device in embodiment 2 of the present invention.
Figure 18:
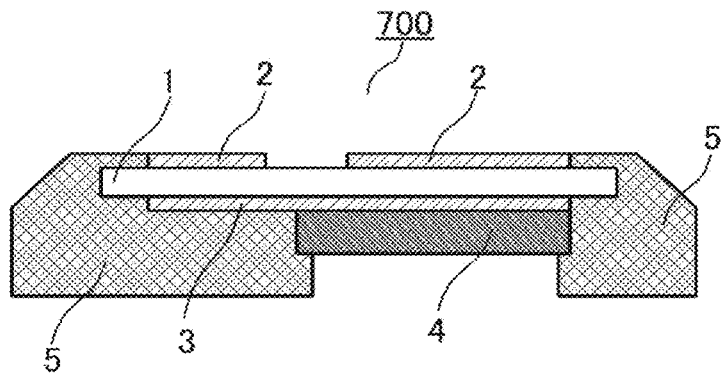
FIG. 18 is a cross-sectional structure schematic diagram showing another semiconductor device in embodiment 2 of the present invention.

FIG. 16 is a plan structure schematic diagram of a semiconductor device in embodiment 2 of the present invention. FIG. 17 is a cross-sectional structure schematic diagram showing a semiconductor device in embodiment 2 of the present invention. A cross-sectional structure schematic diagram taken along dot-and-dash line DD in FIG. 16 is FIG. 17. In the drawings, a semiconductor device 600 includes semiconductor element 1, front-side electrode 2, back-side electrode 3, thick-film electrode 4 (metallic member), and resin member 5. FIG. 18 is a cross-sectional structure schematic diagram of another semiconductor device in embodiment 2 of the present invention. In the drawing, a semiconductor device 700 includes semiconductor element 1, front-side electrode 2, back-side electrode 3, thick-film electrode 4 (metallic member), and resin member 5.

In FIG. 16, resin member 5 is disposed on the front side of semiconductor element 1, from the lateral side of front-side electrode 2 to the outer periphery portion of semiconductor element 1. Resin member 5 is not disposed on a region of the front side of semiconductor element 1, between the lateral sides of front-side electrodes 2 facing each other. That is, the front side of semiconductor element 1 in this region is exposed.

In FIGS. 17 and 18, semiconductor devices 600 and 700 are different from each other in the size (area) of thick-film electrode 4 in the cross-sectional direction. Further, semiconductor devices 600 and 700 are different from each other in the amount of resin member 5 entering the space on the back side of semiconductor element 1. Resin member 5 is formed also on the outer periphery portion of the back side of thick-film electrode 4, on the inner side relative to the lateral side of thick-film electrode 4. As shown in FIGS. 17, 18, in both semiconductor devices 600, 700, back-side electrode 3 is smaller than semiconductor element 1. However, back-side electrode 3 may be formed on substantially the entire back side of semiconductor element 1. If back-side electrode 3 is formed on substantially the entire semiconductor element 1, the heat generated at the heat generation portion of semiconductor element 1 can fully diffuse through thick-film electrode 4. Thus, the thermal resistance can be effectively reduced.

In the case of FIG. 17, thick-film electrode 4 is larger in size than back-side electrode 3, and the outer periphery portion (lateral side) of thick-film electrode 4 protrudes to the outer side relative to the outer periphery portion of back-side electrode 3. Alternatively, thick-film electrode 4 may be smaller in size than back-side electrode 3, and has only to be positioned so that thick-film electrode 4 can efficiently diffuse the heat from the heat generation portion of semiconductor element 1. Accordingly, as shown in FIG. 18, thick-film electrode 4 may be smaller than back-side electrode 3 and larger than the heat generation portion of semiconductor element 1. In this case, a part of the back side of back-side electrode 3 where no thick-film electrode 4 is formed is covered with resin member 5. Note, however, that the contact (joint) area between thick-film electrode 4 and back-side electrode 3 is greater (larger) in semiconductor device 600 in FIG. 17 than in semiconductor device 700 in FIG. 18. Therefore, semiconductor device 600 can better diffuse the heat generated at semiconductor element 1 through thick-film electrode 4, and thus more effectively reduce the thermal resistance than semiconductor device 700.

In FIG. 17, sealing member 5 covers the outer periphery portion of semiconductor element 1, from the front side to the back side of semiconductor element 1. Sealing member 5 is in contact with the lateral sides of front-side electrode 2 and back-side electrode 3. Resin member 5 covers the outer periphery portion of thick-film electrode 4 protruding from the lateral side of back-side electrode 3, from the front side to the back side of thick-film electrode 4. The front side of resin member 5 is flush with the front side of front-side electrode 2. FIG. 18 is different from FIG. 17 in the configuration associated with the back-side electrode. Thick-film electrode 4 is smaller in external shape than back-side electrode 3, and resin member 5 is in contact with a part of the back side of back-side electrode 3 where no thick-film electrode 4 is formed. Resin member 5 is also formed on the outer periphery portion of the back side of thick-film electrode 4.

As with embodiment 1, in semiconductor devices 600, 700 having the above-described configuration, thick-film electrode 4 provided on the back side of back-side electrode 3 compensates for the thinness of semiconductor element 1 and thus can reduce the load on semiconductor element 1. In semiconductor devices 600, 700, resin member 5 covering the peripheries of thick-film electrode 4 and semiconductor element 1 can protect the outer periphery portion of semiconductor element 1, thus preventing chipping, cracking, and other damage of semiconductor element 1 during transportation of semiconductor element 1. Further, unlike a conventional semiconductor element 1 having only resin member 5, semiconductor devices 600, 700 can prevent direct load on semiconductor element 1. Thus, semiconductor devices 600, 700 can reduce the load on semiconductor element 1 during, for example, transportation.

Next, a method for manufacturing a semiconductor device in embodiment 2 is described.

Figure 19:
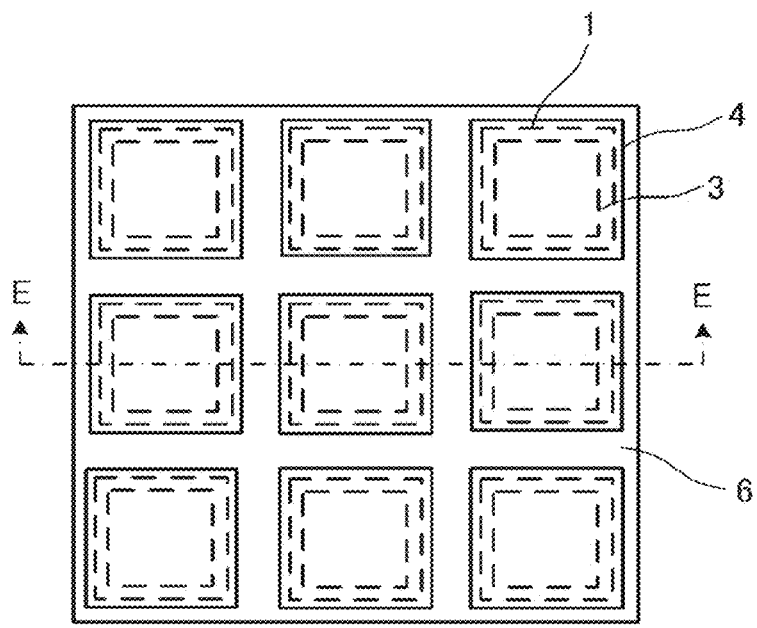
FIG. 19 is a plan structure schematic diagram showing a manufacturing step for a semiconductor device in embodiment 2 of the present invention.
Figure 20:
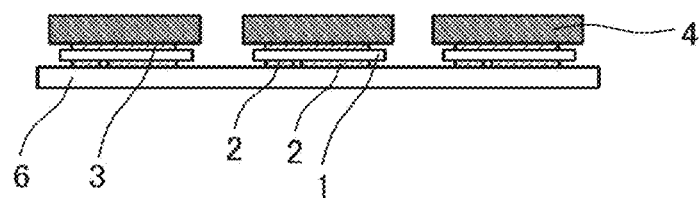
FIG. 20 is a cross-sectional structure schematic diagram showing a manufacturing step for a semiconductor device in embodiment 2 of the present invention.
Figure 21:
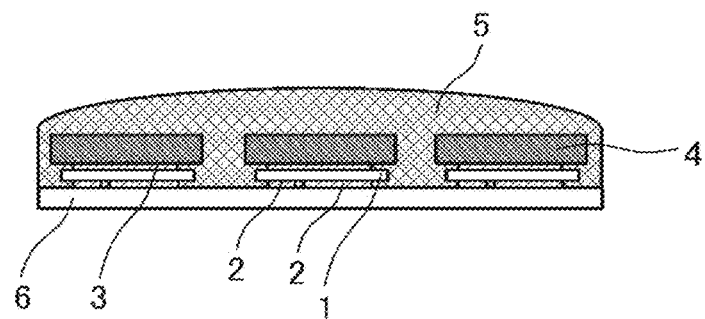
FIG. 21 is a cross-sectional structure schematic diagram showing a manufacturing step for a semiconductor device in embodiment 2 of the present invention.
Figure 22:
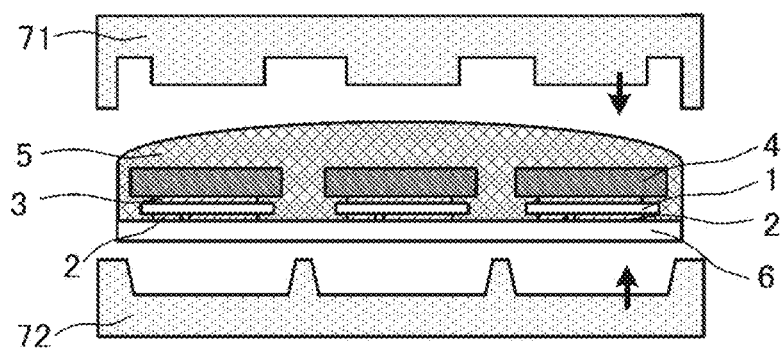
FIG. 22 is a cross-sectional structure schematic diagram showing a manufacturing step for a semiconductor device in embodiment 2 of the present invention.
Figure 23:
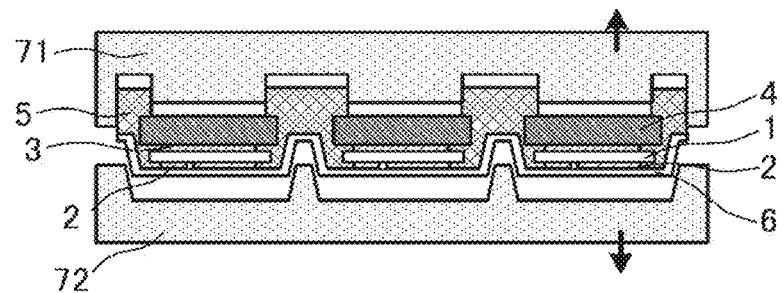
FIG. 23 is a cross-sectional structure schematic diagram showing a manufacturing step for a semiconductor device in embodiment 2 of the present invention.
Figure 24:
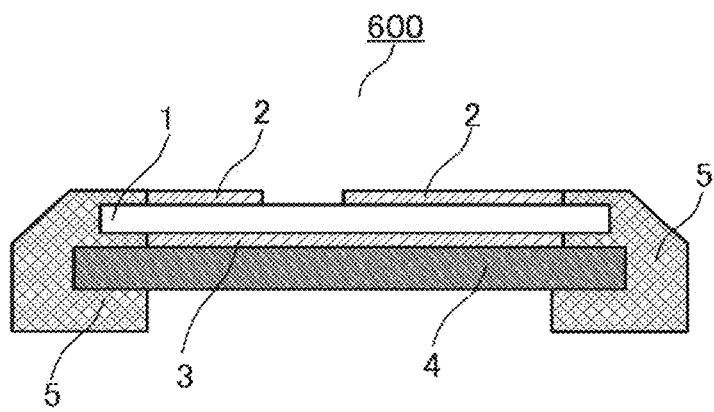
FIG. 24 is a cross-sectional structure schematic diagram showing a manufacturing step for a semiconductor device in embodiment 2 of the present invention.

Basically, the manufacturing steps in embodiment 1 can be used for manufacturing in embodiment 2. However, embodiment 2 is different from embodiment 1 in the method for forming resin member 5 on the periphery of thick-film electrode 4. FIG. 19 is a plan structure schematic diagram showing a manufacturing step for a semiconductor device in embodiment 2 of the present invention. FIG. 20 is a cross-sectional structure schematic diagram showing a manufacturing step for a semiconductor device in embodiment 2 of the present invention. FIG. 21 is a cross-sectional structure schematic diagram showing a manufacturing step for a semiconductor device in embodiment 2 of the present invention. FIG. 22 is a cross-sectional structure schematic diagram showing a manufacturing step for a semiconductor device in embodiment 2 of the present invention. FIG. 23 is a cross-sectional structure schematic diagram showing a manufacturing step for a semiconductor device in embodiment 2 of the present invention. FIG. 24 is a cross-sectional structure schematic diagram showing a manufacturing step for a semiconductor device in embodiment 2 of the present invention. The steps up to the semiconductor element cutting step shown in embodiment 1 can be similarly used.

Examples of methods for covering (surrounding) the periphery of thick-film electrode 4 with resin member 5 include injecting resin member 5 by potting using a protective sheet 6, and injecting resin member 5 under pressure by compression molding.

A manufacturing method using potting with protective sheet 6 is hereinafter described. As to a method of manufacturing semiconductor element 1, the same way as that of embodiment 1 may be used.

After cutting into individual semiconductor elements 1, as shown in FIG. 19, each semiconductor element 1 is placed on protective sheet 6 in such a way that the front side of front-side electrode 2 is on the front side of protective sheet 6 (semiconductor element placement step). FIG. 19 shows semiconductor elements 1 in 3×3 array. However, the number of semiconductor elements 1 is not limited to this, but may be one, or more than 3×3. A cross-sectional structure schematic diagram taken along dot-and-dash line EE in FIG. 19 is FIG. 20.

Next, as shown in FIG. 21, resin member 5 is put (applied) by potting, so that resin member 5 covers thick-film electrode 4 of semiconductor element 1 (resin member application step). At this time, resin member 5 may be formed while protective sheet 6, having semiconductor elements 1 thereon, is placed in a case as used in embodiment 1.

Next, as shown in FIGS. 22, 23, unnecessary parts of resin member 5 are removed using a die. An upper die 71 and a lower die 72 with protective sheet 6 held therebetween are pressed together, thereby molding resin member 5 into the shape according to the die (resin member molding step). However, resin member 5 cannot be fully removed by the die alone. In order to fully expose the front side of thick-film electrode 4, resin member 5 remaining on the front side of thick-film electrode 4 is removed by, for example, laser, or resin member 5 is removed by grinding or abrasion until the front side of thick-film electrode 4 is exposed (metallic member exposing step). The arrows in the drawing indicate the direction of movement of upper die 71 and lower die 72.

Next, resin member 5 is cut in accordance with the molded shape (resin member cutting step), and semiconductor element 1 is detached from protective sheet 6 (semiconductor element detachment step). In this way, semiconductor device 600 having a structure as shown in FIG. 24 is formed. Thus, since resin member 5 covers the periphery of thick-film electrode 4, thin semiconductor element 1, which is difficult to handle, can be handled without being touched.

In a semiconductor device having the above-described configuration, thick-film electrode 4 is formed on back-side electrode 3 of semiconductor element 1, and the periphery of thick-film electrode 4 is covered with resin member 5. Accordingly, the load on semiconductor element 1 can be reduced during handling of semiconductor element 1, thus enabling easy transportation of thin semiconductor element 1.

Further, thick-film electrode 8 is formed on the front side of front-side electrode 2 on the front side of semiconductor element 1, and the periphery of thick-film electrode 8 is covered with resin member 5. Accordingly, the load on semiconductor element 1 can be reduced during handling of semiconductor element 1, thus enabling easy transportation of thin semiconductor element 1.

Further, since thick-film electrode 4 and thick-film electrode 8 are formed respectively on back-side electrode 3 and front-side electrode 2 of semiconductor element 1, the electrodes on semiconductor element 1 are increased in thickness. Accordingly, heat radiation from semiconductor element 1 is promoted, and the semiconductor device is improved in short-circuit capacity.

Further, thick-film electrodes 4, 8 are made of a sintered material of copper or silver nanoparticles, and thus have porosity peculiar to sintered material. Accordingly, thick-film electrodes 4, 8, though thick, can relax the thermal stress generated due to a difference in coefficient of linear expansion. Therefore, the load on semiconductor element 1 can be reduced.

Further, if semiconductor devices 600, 700 need to be connected to a cooler for cooling semiconductor element 1, the height of the joint material can be adjusted by adjusting the degree of protrusion of resin member 5.

Embodiment 3

Embodiment 3 is different from embodiment 1 in the placement of thick-film electrode 4 and resin member 5. Specifically, in embodiment 3, thick-film electrode 4 is larger than semiconductor element 1, and resin member 5 is in contact with only thick-film electrode 4. In the other respects, embodiment 3 is the same as embodiment 1, and thus the detailed description is not repeated.

With this configuration, thick-film electrode 4 is formed on the back side of back-side electrode 3, and the periphery of thick-film electrode 4 is covered with resin member 5. Accordingly, the load on semiconductor element 1 can be reduced during handling of semiconductor element 1, thus enabling easy transportation of thin semiconductor element 1.

Figure 25:
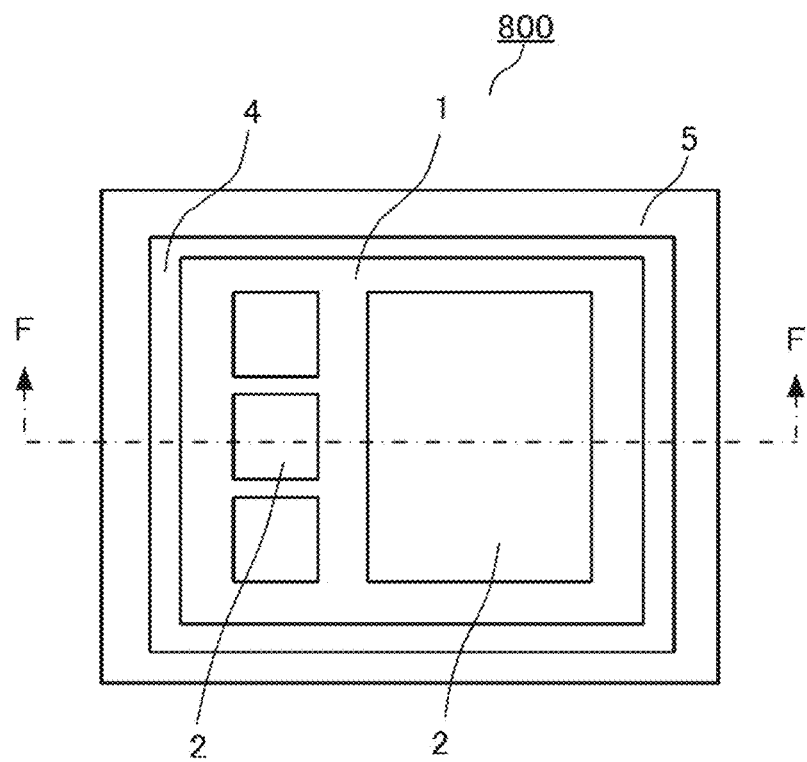
FIG. 25 is a plan structure schematic diagram showing a semiconductor device in embodiment 3 of the present invention.
Figure 26:
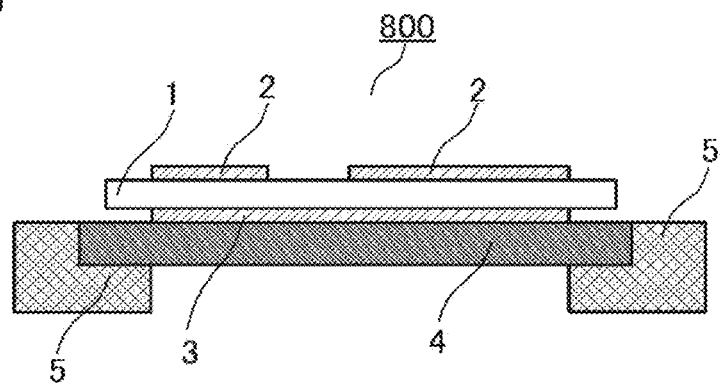
FIG. 26 is a cross-sectional structure schematic diagram showing a semiconductor device in embodiment 3 of the present invention.

FIG. 25 is a plan structure schematic diagram of a semiconductor device in embodiment 3 of the present invention. FIG. 26 is a cross-sectional structure schematic diagram showing a semiconductor device in embodiment 3 of the present invention. A cross-sectional structure schematic diagram taken along dot-and-dash line FF in FIG. 25 is FIG. 26. In the drawings, a semiconductor device 800 includes semiconductor element 1, front-side electrode 2, back-side electrode 3, thick-film electrode 4 (metallic member), and resin member 5.

Thick-film electrode 4 is formed on the back side of back-side electrode 3. Thick-film electrode 4 is larger in external shape than semiconductor element 1, and the outer periphery portion of thick-film electrode 4 protrudes to the outer side relative to the outer periphery portion of semiconductor element 1. That is, thick-film electrode 4 is larger than semiconductor element 1.

Resin member 5 is in contact with the lateral side of thick-film electrode 4 and surrounds the periphery of thick-film electrode 4. Resin member 5 is formed on the outer periphery portion of the back side of thick-film electrode 4, with a part of the back side of thick-film electrode 4 being exposed. The front side of front-side electrode 2 and the back side of thick-film electrode 4 are exposed through resin member 5 for electrical connection.

Next, a method for manufacturing a semiconductor device in embodiment 3 is described.

In embodiment 3, the steps up to the semiconductor element cutting step shown in embodiment 1 can be similarly used.

Figure 27:
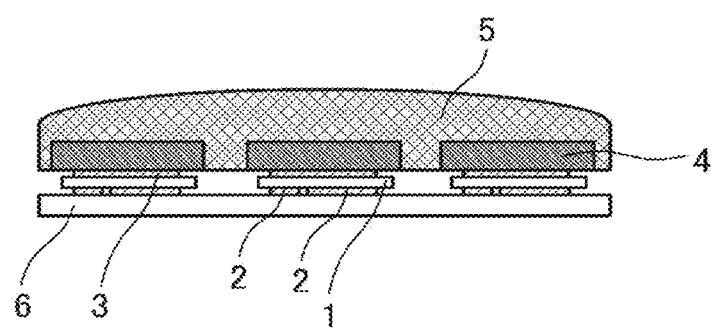
FIG. 27 is a cross-sectional structure schematic diagram showing a manufacturing step for a semiconductor device in embodiment 3 of the present invention.
Figure 28:
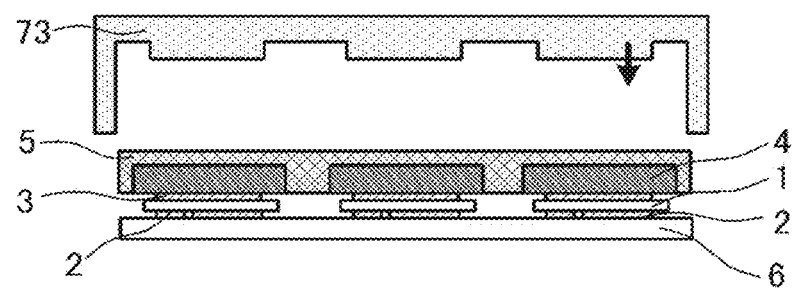
FIG. 28 is a cross-sectional structure schematic diagram showing a manufacturing step for a semiconductor device in embodiment 3 of the present invention.
Figure 29:
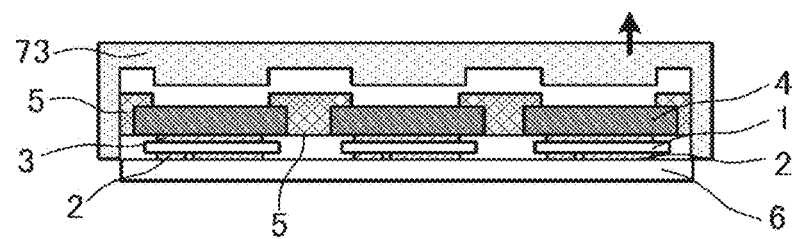
FIG. 29 is a cross-sectional structure schematic diagram showing a manufacturing step for a semiconductor device in embodiment 3 of the present invention.
Figure 30:
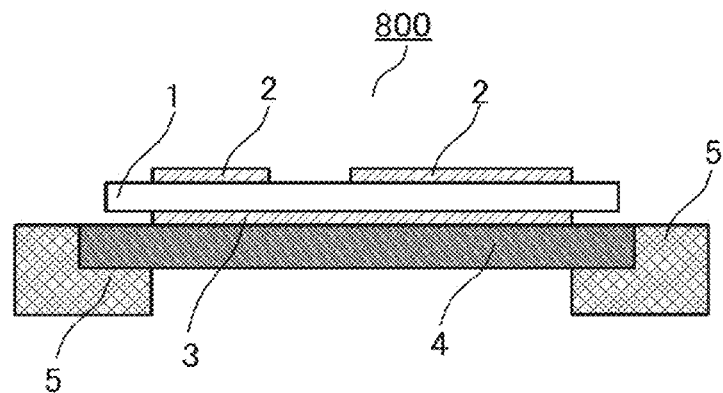
FIG. 30 is a cross-sectional structure schematic diagram showing a manufacturing step for a semiconductor device in embodiment 3 of the present invention.

FIG. 27 is a cross-sectional structure schematic diagram showing a manufacturing step for a semiconductor device in embodiment 3 of the present invention. FIG. 28 is a cross-sectional structure schematic diagram showing a manufacturing step for a semiconductor device in embodiment 3 of the present invention. FIG. 29 is a cross-sectional structure schematic diagram showing a manufacturing step for a semiconductor device in embodiment 3 of the present invention. FIG. 30 is a cross-sectional structure schematic diagram showing a manufacturing step for a semiconductor device in embodiment 3 of the present invention.

A manufacturing method using potting with protective sheet 6 is hereinafter described. As to a method of manufacturing semiconductor element 1, the same way as that of embodiment 1 may be used.

After cutting into individual semiconductor elements 1, as shown in FIG. 27, each semiconductor element 1 is placed on protective sheet 6 in such a way that the front side of front-side electrode 2 is on the front side of protective sheet 6 (semiconductor element placement step). FIG. 27 shows semiconductor elements 1 in 3×3 array in cross section. However, the number of semiconductor elements 1 is not limited to this, but may be one, or more than 3×3.

After the front side of front-side electrode 2 of semiconductor element 1 is placed on protective sheet 6, resin member 5 is put (applied) by potting, so that resin member 5 covers up to the lateral side of thick-film electrode 4 of semiconductor element 1 (resin application step). At this time, resin member 5 may be formed while protective sheet 6, having semiconductor elements 1 thereon, is placed in a case as used in embodiment 1. In order to provide resin member 5 in the shape as shown in FIG. 27, the viscosity, amount of filler, and coefficient of linear expansion of resin member 5, and the placement of semiconductor element 1 with thick-film electrode 4 may be adjusted. Thus, resin member 5 can cover the periphery of thick-film electrode 4 without reaching the periphery of semiconductor element 1.

After that, from the state in which thick-film electrode 4 is covered with resin member 5, resin member 5 on the back side of thick-film electrode 4 needs to be removed to a certain extent, so as to expose the electrode surface (back side) of thick-film electrode 4. Resin member 5 may be removed into a predetermined thickness by, for example, laser, or resin member 5 may be removed by grinding or abrasion until the back side of thick-film electrode 4 is exposed.

For example, a state after resin member 5 has been removed by grinding or abrasion is shown in FIG. 28. The product can be transported in this state. Further, resin member 5 can be cut by, for example, dicing, and semiconductor devices 800 can be taken out of protective sheet 6 one by one. At the time of handling of fragile semiconductor element 1 (including the time of the takeout), semiconductor element 1 can be handled through resin member 5 and without being directly touched.

Next, as shown in FIG. 28, unnecessary parts of resin member 5 on the back side of thick-film electrode 4 are removed using an upper die 73. With upper die 73, a pressure is applied to semiconductor element 1 placed on protective sheet 6, and thus resin member 5 is molded in accordance with the shape of upper die 73 (resin member molding step). This eliminates almost all the resin member 5 from the back side of thick-film electrode 4. Further, resin member 5 slightly remaining on the back side of thick-film electrode 4 is removed by, for example, laser. Thus, the electrode surface of thick-film electrode 4 can be exposed. Alternatively, resin member 5 can be formed into such a shape directly by compression molding in which resin member 5 is injected in a die under pressure.

Next, resin member 5 is cut in accordance with the molded shape (resin member cutting step), and semiconductor element 1 is detached from protective sheet 6 (semiconductor element detachment step). In this way, semiconductor device 800 having a structure as shown in FIG. 30 is formed. Thus, since thick-film electrode 4 is disposed on the back side of back-side electrode 3 of semiconductor element 1, and resin member 5 covers the periphery of thick-film electrode 4, thin semiconductor element 1, which is difficult to handle, can be handled without being touched.

Embodiment 3 shows a technique in which protective sheet 6 is used for semiconductor elements 1 to be arranged thereon, by way of example. However, it is needless to say that, in the potting, resin member 5 may be directly poured into a case with semiconductor elements 1 placed therein, without using protective sheet 6.

In a semiconductor device having the above-described configuration, thick-film electrode 4 is formed on the back side of back-side electrode 3 of semiconductor element 1, and the periphery of thick-film electrode 4 is covered with resin member 5. Accordingly, the load on semiconductor element 1 can be reduced during handling of semiconductor element 1, thus enabling easy transportation of thin semiconductor element 1.

Further, thick-film electrode 4 is made of a sintered material of copper or silver nanoparticles, and thus has porosity peculiar to sintered material. Accordingly, thick-film electrode 4, though thick, can relax the thermal stress generated due to a difference in coefficient of linear expansion. Therefore, the load on semiconductor element 1 can be reduced.

Embodiment 4

Embodiment 4 is different from embodiment 3 in the placement of resin member 5. Specifically, in embodiment 4, resin member 5 has a height such that resin member 5 is flush with the front side of front-side electrode 2. In the other respects, embodiment 4 is the same as embodiment 3, including the advantageous effects, and thus the detailed description is not repeated.

With this configuration, thick-film electrode 4 is formed on the back side of back-side electrode 3, and the periphery of thick-film electrode 4 is covered with resin member 5. Accordingly, the load on semiconductor element 1 can be reduced during handling of semiconductor element 1, thus enabling easy transportation of thin semiconductor element 1. Further, resin member 5 surrounding the lateral side of semiconductor element 1 prevents semiconductor element 1 from being touched from the lateral side of semiconductor element 1. Thus, chipping and other damage to semiconductor element 1 can be prevented.

Figure 31:
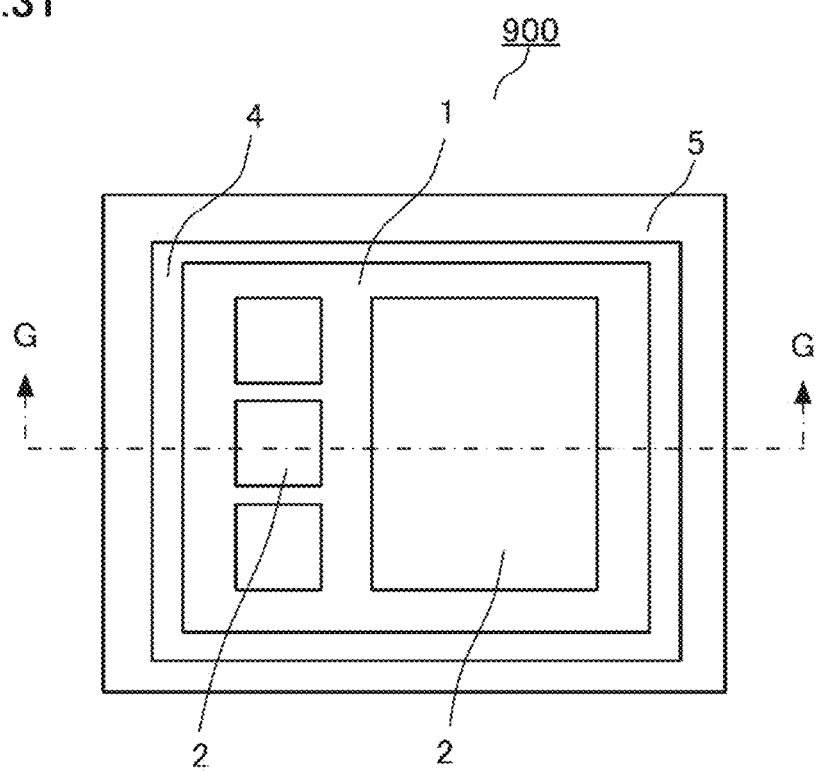
FIG. 31 is a plan structure schematic diagram showing a semiconductor device in embodiment 4 of the present invention.
Figure 32:
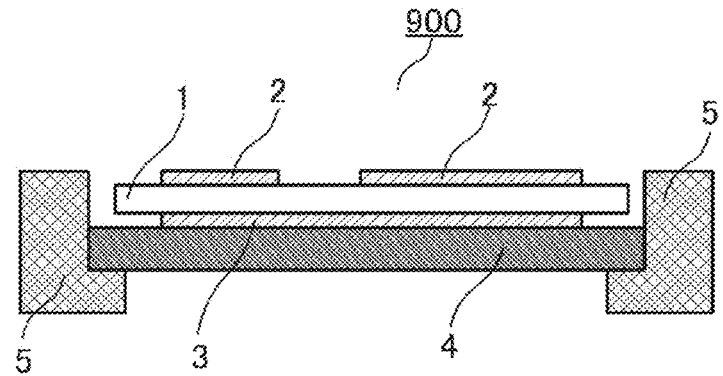
FIG. 32 is a cross-sectional structure schematic diagram showing a semiconductor device in embodiment 4 of the present invention.

FIG. 31 is a plan structure schematic diagram of a semiconductor device in embodiment 4 of the present invention. FIG. 32 is a cross-sectional structure schematic diagram showing a semiconductor device in embodiment 4 of the present invention. A cross-sectional structure schematic diagram taken along dot-and-dash line GG in FIG. 31 is FIG. 32. In the drawings, a semiconductor device 900 includes semiconductor element 1, front-side electrode 2, back-side electrode 3, thick-film electrode 4 (metallic member), and resin member 5.

Thick-film electrode 4 is larger in external shape than semiconductor element 1, and the outer periphery portion of thick-film electrode 4 protrudes to the outer side relative to the outer periphery portion of semiconductor element 1.

In FIG. 32, resin member 5 is in contact with the lateral side of thick-film electrode 4 and surrounds the periphery of thick-film electrode 4. Resin member 5 protrudes to the front side of semiconductor element 1 and surrounds the periphery of semiconductor element 1. Further, resin member 5 protruding to the front side of semiconductor element 1 has a height such that resin member 5 is flush with the front side of front-side electrode 2. Resin member 5 is also formed on the back side of thick-film electrode 4. At this time, resin member 5 is formed on the outer periphery portion of the back side of thick-film electrode 4, with a part of the back side of thick-film electrode 4 being exposed. The front side of front-side electrode 2 and the back side of thick-film electrode 4 are exposed through resin member 5 for electrical connection.

Next, a method for manufacturing a semiconductor device in embodiment 4 is described.

The steps up to the semiconductor element cutting step shown in embodiment 1 can be similarly used.

Figure 33:
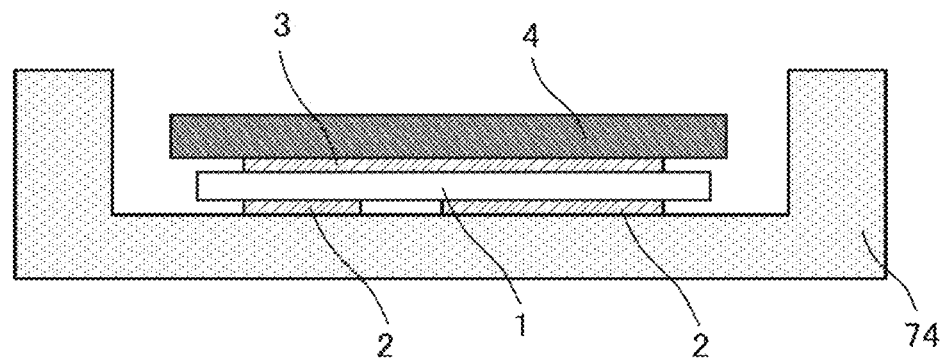
FIG. 33 is a cross-sectional structure schematic diagram showing a manufacturing step for a semiconductor device in embodiment 4 of the present invention.
Figure 34:
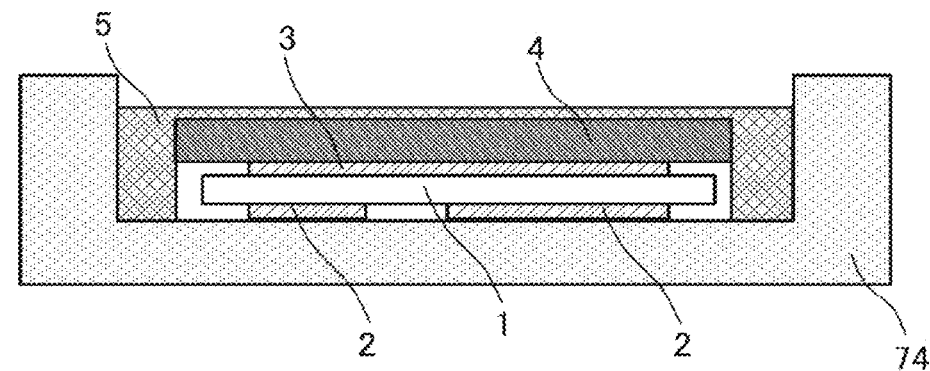
FIG. 34 is a cross-sectional structure schematic diagram showing a manufacturing step for a semiconductor device in embodiment 4 of the present invention.
Figure 35:
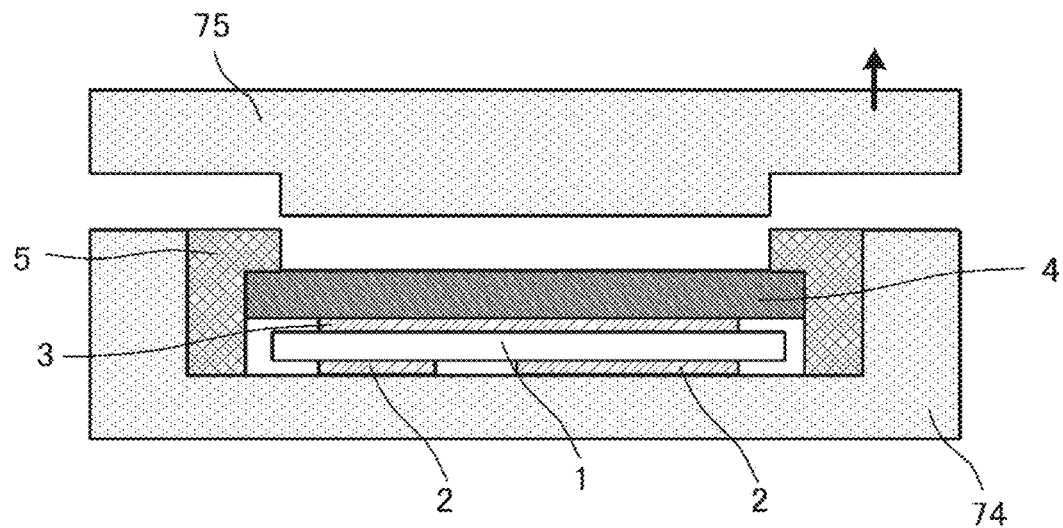
FIG. 35 is a cross-sectional structure schematic diagram showing a manufacturing step for a semiconductor device in embodiment 4 of the present invention.
Figure 36:
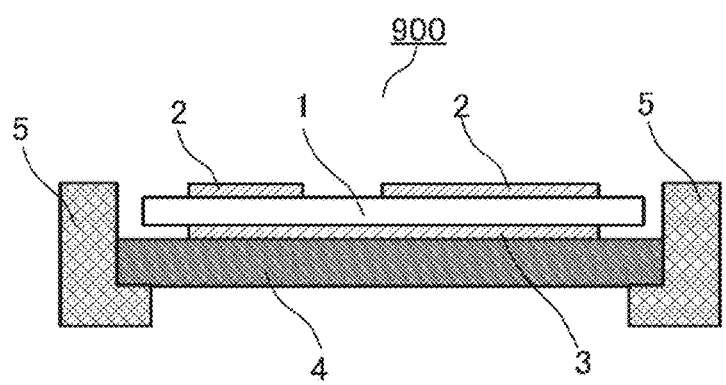
FIG. 36 is a cross-sectional structure schematic diagram showing another semiconductor device in embodiment 4 of the present invention.

FIG. 33 is a cross-sectional structure schematic diagram showing a manufacturing step for a semiconductor device in embodiment 4 of the present invention. FIG. 34 is a cross-sectional structure schematic diagram showing a manufacturing step for a semiconductor device in embodiment 4 of the present invention. FIG. 35 is a cross-sectional structure schematic diagram showing a manufacturing step for a semiconductor device in embodiment 4 of the present invention. FIG. 36 is a cross-sectional structure schematic diagram showing a manufacturing step for a semiconductor device in embodiment 4 of the present invention.

As to a method of manufacturing semiconductor element 1, the same way as that of embodiment 1 may be used.

After cutting into individual semiconductor elements 1, as shown in FIG. 33, each semiconductor element 1 is placed in a lower die 74 in such a way that the front side of front-side electrode 2 is in contact with the bottom side of lower die 74 (semiconductor element placement step). FIG. 33 shows one semiconductor element 1 in cross section. However, the number of semiconductor elements 1 is not limited to this, but may be 3×3 or more.

Next, as shown in FIG. 34, after semiconductor element 1 is placed in lower die 74, resin member 5 is put (applied) by potting, so that resin member 5 covers thick-film electrode 4 of semiconductor element 1 (resin application step). At this time, the viscosity, amount of filler, and coefficient of linear expansion of resin member 5 to be poured in lower die 74, and the placement of semiconductor element 1 with thick-film electrode 4 may be adjusted, so that resin member 5 can surround the periphery of semiconductor element 1 on which thick-film electrode 4 is formed, without reaching the periphery of semiconductor element 1.

Next, as shown in FIG. 35, unnecessary parts of resin member 5 on the back side of thick-film electrode 4 are removed using an upper die 75. With upper die 75, a pressure is applied to semiconductor element 1 placed in lower die 74, and thus resin member 5 is molded in accordance with the shape of lower die 74 (resin member formation step). This eliminates almost all the resin member 5 from the back side of thick-film electrode 4. Further, resin member 5 slightly remaining on the back side of thick-film electrode 4 is removed by, for example, laser. Thus, the back side of thick-film electrode 4 can be exposed. If residue resin member 5 is still adhering to front-side electrode 2 after semiconductor element 1 is taken out of lower die 74 after unnecessary resin member 5 is removed from the back side of thick-film electrode 4 by upper die 75, the residue may be removed by, for example, laser, so that the front side of front-side electrode 2 and the back side of thick-film electrode 4 can be exposed.

Through these steps, semiconductor device 900 having a structure as shown in FIG. 36 is formed (semiconductor element takeout step). Thus, since resin member 5 covers the periphery of thick-film electrode 4, thin semiconductor element 1, which is difficult to handle, can be handled without being touched.

Figure 37:
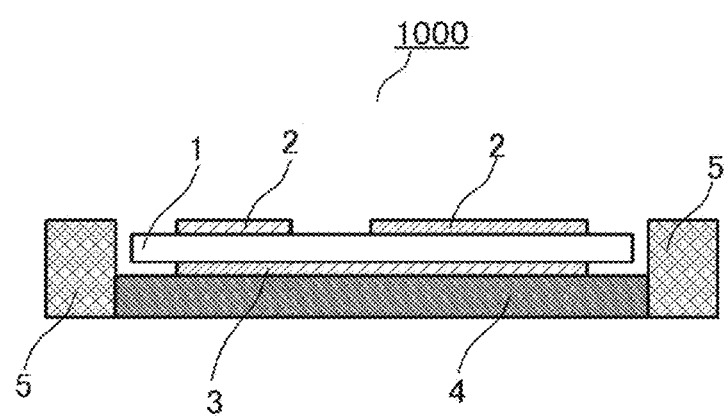
FIG. 37 is a cross-sectional structure schematic diagram showing another semiconductor device in embodiment 4 of the present invention.

FIG. 37 is a cross-sectional structure schematic diagram showing another semiconductor device in embodiment 4 of the present invention. In the drawing, a semiconductor device 1000 includes semiconductor element 1, front-side electrode 2, back-side electrode 3, thick-film electrode 4 (metallic member), and resin member 5.

Thick-film electrode 4 is larger in external shape than semiconductor element 1 and protrudes to the outer side relative to the outer periphery portion of semiconductor element 1.

Resin member 5 is in contact with the lateral side of thick-film electrode 4 and surrounds the periphery of thick-film electrode 4. Resin member 5 protrudes to the front side of semiconductor element 1, with the entire back side of thick-film electrode 4 being exposed. Further, resin member 5 has a height such that resin member 5 is flush with the front side of front-side electrode 2. Resin member 5 is not formed on the back side of thick-film electrode 4, in which respect semiconductor device 1000 is different from semiconductor device 900.

In semiconductor devices having the above-described configurations, thick-film electrode 4 is formed on the back side of back-side electrode 3 of semiconductor element 1, and the peripheries of semiconductor element 1 and thick-film electrode 4 are covered with resin member 5. Accordingly, the load on semiconductor element 1 can be reduced during handling of semiconductor element 1. Thus, chipping of semiconductor element 1 can be prevented, and thin semiconductor element 1 can be easily transported.

Further, since thick-film electrode 4 is formed on back-side electrode 3 of semiconductor element 1, the electrode on semiconductor element 1 is increased in thickness. Accordingly, heat radiation from semiconductor element 1 is promoted, and the semiconductor device is improved in short-circuit capacity.

Further, thick-film electrode 4 is made of a sintered material of copper or silver nanoparticles, and thus has porosity peculiar to sintered material. Accordingly, thick-film electrode 4, though thick, can relax the thermal stress generated due to a difference in coefficient of linear expansion. Therefore, the load on semiconductor element 1 can be reduced.

Embodiment 5

Embodiment 5 is different from embodiment 1 in the placement of resin member 5. Specifically, in embodiment 5, resin member 5 has a height such that resin member 5 is flush with the front side of thick-film electrode 8 formed on the front side of front-side electrode 2. Also, embodiment 5 is different from embodiment 1 in the size of thick-film electrode 4 formed on the back side of back-side electrode 3. In the other respects, embodiment 5 is the same as embodiment 1, including the advantageous effects, and thus the detailed description is not repeated.

With this configuration, thick-film electrode 4 is formed on the back side of back-side electrode 3, and the periphery of thick-film electrode 4 is covered with resin member 5. Accordingly, the load on semiconductor element 1 can be reduced during handling of semiconductor element 1, thus enabling easy transportation of thin semiconductor element 1.

Figure 38:
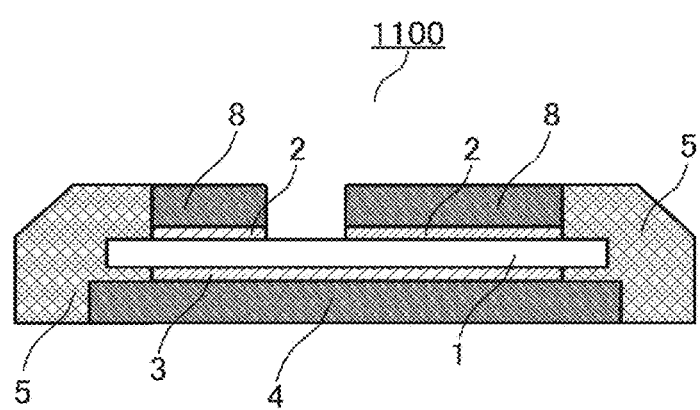
FIG. 38 is a cross-sectional structure schematic diagram showing a semiconductor device in embodiment 5 of the present invention.

FIG. 38 is a cross-sectional structure schematic diagram of a semiconductor device in embodiment 5 of the present invention. In the drawing, a semiconductor device 1100 includes semiconductor element 1, front-side electrode 2, back-side electrode 3, thick-film electrodes 4, 8 (metallic members), and resin member 5.

Thick-film electrode 4 is formed on the back side of back-side electrode 3. Thick-film electrode 4 is larger in external shape than semiconductor element 1, and protrudes to the outer side relative to the outer periphery portion (lateral side) of semiconductor element 1.

Thick-film electrode 8 is formed on the front side of front-side electrode 2. Thick-film electrode 8 is the same size as front-side electrode 2. Thick-film electrode 8 may be made of a sintered material of copper or silver nanoparticles, for example. Thick-film electrode 4 may be made of the same material as thick-film electrode 8.

Resin member 5 is in contact with the lateral sides of thick-film electrodes 4 and 8 and surrounds the peripheries of thick-film electrodes 4 and 8. Resin member 5 has a height such that resin member 5 is flush with the front side of thick-film electrode 8. Resin member 5 is not formed on the back side of thick-film electrode 4. Further, the front side of thick-film electrode 8 formed on the front side of front-side electrode 2 is exposed through resin member 5. Also, the back side of thick-film electrode 4 formed on the back side of back-side electrode 3 is exposed through resin member 5. Resin member 5 is in contact with: the lateral side of front-side electrode 2, the lateral side of thick-film electrode 8 formed on the front side of front-side electrode 2, and the lateral side of back-side electrode 3, adjacent to the outer periphery of semiconductor element 1. Resin member 5 protrudes from the lateral side of back-side electrode 3 to the outer side. Resin member 5 covers the front side of thick-film electrode 4 formed on the back side of back-side electrode 3, and also covers the outer periphery portion of semiconductor element 1.

This semiconductor device 1100 can be produced by combining the manufacturing steps in the above-described embodiments 1 to 4 as appropriate.

For example, front-side electrode 2 and back-side electrode 3 are formed on a semiconductor wafer. Then, thick-film electrode 8 is joined to the front side of front-side electrode 2. The semiconductor wafer is cut into individual semiconductor elements 1, and then thick-film electrode 4 is joined to the back side of back-side electrode 3. Then, the front side of front-side electrode 2 is protected with protective sheet 6, and resin member 5 is molded in a die by potting or by compression molding. Then, resin member 5 on the front side of thick-film electrode 8 is removed by grinding or abrasion. Then, it is divided into individual semiconductor devices 1100, and the protective sheet is peeled from the front side of front-side electrode 2. In this way, semiconductor device 1100 is formed.

In a semiconductor device having the above-described configuration, thick-film electrode 8 is formed on the front side of front-side electrode 2 of semiconductor element 1, and thick-film electrode 4 is formed on the back side of back-side electrode 3 of semiconductor element 1. Also, the peripheries of thick-film electrodes 4 and 8 are covered with resin member 5. Accordingly, the load on semiconductor element 1 can be reduced during handling of semiconductor element 1, thus enabling easy transportation of thin semiconductor element 1.

Further, since thick-film electrode 4 and thick-film electrode 8 are formed respectively on back-side electrode 3 and front-side electrode 2 of semiconductor element 1, the electrodes on semiconductor element 1 are increased in thickness. Accordingly, heat radiation from semiconductor element 1 is promoted, and the semiconductor device is improved in short-circuit capacity.

Further, thick-film electrode 8 is made of a sintered material of copper or silver nanoparticles, and thus has porosity peculiar to sintered material. Accordingly, thick-film electrode 8, though thick, can relax the thermal stress generated due to a difference in coefficient of linear expansion. Therefore, the load on semiconductor element 1 can be reduced.

Embodiment 6

Embodiment 6 is different from embodiment 1 in that only thick-film electrode 8 is formed on the front side of front-side electrode 2, and in that resin member 5 is higher than the height of the front side of thick-film electrode 8. In the other respects, embodiment 6 is the same as embodiment 1, including the advantageous effects, and thus the detailed description is not repeated.

With this configuration, since the periphery of thick-film electrode 8 is covered with resin member 5, the load on semiconductor element 1 can be reduced during handling of semiconductor element 1, thus enabling easy transportation of thin semiconductor element 1.

Figure 39:
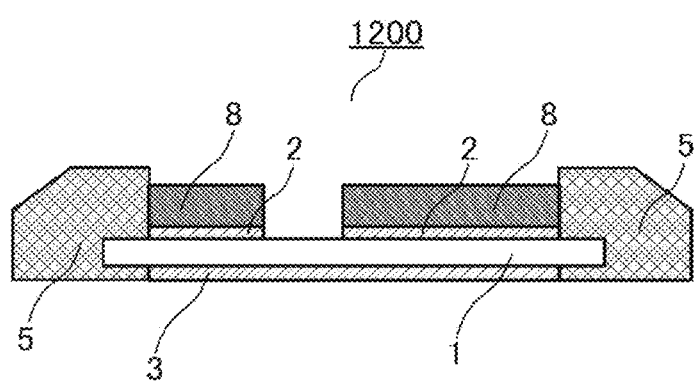
FIG. 39 is a cross-sectional structure schematic diagram showing a semiconductor device in embodiment 6 of the present invention.

FIG. 39 is a cross-sectional structure schematic diagram of a semiconductor device in embodiment 6 of the present invention. In the drawing, a semiconductor device 1200 includes semiconductor element 1, front-side electrode 2, back-side electrode 3, thick-film electrode 8 (metallic member), and resin member 5.

Thick-film electrode 8 is formed on the front side of front-side electrode 2. Thick-film electrode 8 is the same size as front-side electrode 2. Thick-film electrode 8 may be made of a sintered material of copper or silver nanoparticles, for example.

Resin member 5 is in contact with the lateral side of thick-film electrode 8 and surrounds the periphery of thick-film electrode 8. Resin member 5 is in contact with the lateral sides of front-side electrode 2 and back-side electrode 3 adjacent to the outer periphery of semiconductor element 1, with the front side of thick-film electrode 8 being exposed. Further, resin member 5 covers the outer periphery portion of semiconductor element 1 protruding from the lateral side of back-side electrode 3 to the outer side. Resin member 5 is higher than the height of the front side of thick-film electrode 8. Resin member 5, higher than the height of the front side of thick-film electrode 8, can protect the front side of thick-film electrode 8 against damage during, for example, transportation of semiconductor element 1.

This semiconductor device 1200 can be produced by combining the manufacturing steps in the above-described embodiments 1 to 4 as appropriate.

For example, front-side electrode 2 and back-side electrode 3 are formed on a predetermined region of semiconductor wafer 10. Then, semiconductor wafer 10 is cut into individual semiconductor elements 1. After cutting into individual semiconductor elements 1, resin member 5 is applied by potting, and resin member 5 on the front side of front-side electrode 2 is thinned using a die. Also, semiconductor element 1 is sealed with resin by, for example, compression molding. After that, resin member 5 on the front side of front-side electrode 2 is removed by, for example, laser. Then, paste or ink containing copper or silver nanoparticles is applied to the front side of front-side electrode 2 in an open space surrounded by resin member 5. Then, the applied paste or ink is sintered into thick-film electrode 8. Through these steps, semiconductor device 1200 is formed.

In a semiconductor device having the above-described configuration, thick-film electrode 8 is formed on the front side of front-side electrode 2 of semiconductor element 1, and the periphery of thick-film electrode 8 is covered with resin member 5. Accordingly, the load on semiconductor element 1 can be reduced during handling of semiconductor element 1, thus enabling easy transportation of thin semiconductor element 1.

Further, thick-film electrode 8 is made of a sintered material of copper or silver nanoparticles, and thus has porosity peculiar to sintered material. Accordingly, thick-film electrode 8, though thick, can relax the thermal stress generated due to a difference in coefficient of linear expansion. Therefore, the load on semiconductor element 1 can be reduced.

Further, since thick-film electrode 8 is formed on front-side electrode 2 of semiconductor element 1, the electrode on semiconductor element 1 is increased in thickness. Accordingly, heat radiation from semiconductor element 1 is promoted, and the semiconductor device is improved in short-circuit capacity.

It should be understood that the above-described embodiments are by way of example in every respect, not by way of limitation. The scope of the present invention is defined not by the scope of the above-described embodiments but by the terms of the claims, and includes any modification within the meaning and scope equivalent to the terms of the claims.

The present invention may be formed by combining, as appropriate, a plurality of components disclosed in the above embodiments.

REFERENCE SIGNS LIST

1: semiconductor element; 2: front-side electrode; 3: back-side electrode; 4, 8: thick-film electrode; 5: resin member; 6: protective sheet; 10: semiconductor wafer; 11: nozzle; 12: case; 40: insulating circuit substrate; 41: insulating substrate; 42, 43:

conductor layer; 60: electrode terminal; 70: sealing member; 71, 73, 75: upper die; 72, 74: lower die; 80: joint material; 90: cooler; 91: cooling pin; 100, 200, 300, 400, 500, 600, 700, 800, 900, 1000, 1100, 1200: semiconductor device; 2000: semiconductor module

The invention claimed is:

1. A semiconductor device comprising:
a thin semiconductor element including a front-side electrode on a front side of the semiconductor element, and including a back-side electrode on a back side of the semiconductor element;
a metallic member formed on at least one of a front side of the front-side electrode and a back side of the back-side electrode, the metallic member having a thickness equal to or greater than a thickness of the semiconductor element; and
a resin member in contact with a lateral side of the metallic member and surrounding a periphery of the metallic member, with a part of the front side of the semiconductor element being exposed,
wherein the metallic member is provided inside an outer circumference of the thin semiconductor element in a plan view.

2. The semiconductor device according to claim 1, wherein the resin member surrounds a periphery of the semiconductor element.

3. The semiconductor device according to claim 2, wherein the resin member is in contact with a lateral side of the semiconductor element and covers an outer periphery portion of at least one of the front side of the semiconductor element and the back side of the semiconductor element.

4. The semiconductor device according to claim 1, wherein
a front side of the metallic member is in contact with the back side of the back-side electrode, and
the metallic member is larger in area than the back-side electrode in a plan View.

5. The semiconductor device according to claim 4, wherein the resin member covers an outer periphery portion of at least one of the front side of the metallic member and a back side of the metallic member.

6. The semiconductor device according to claim 3, wherein
the metallic member is smaller in area than the back-side electrode in a plan view,
a front side of the metallic member is in contact with the back side of the back-side electrode, and
the resin member is in contact with the back side of the back-side electrode.

7. The semiconductor device according to claim 3, wherein
a back side of the metallic member is in contact with the front side of the front-side electrode, and
the resin member is higher or lower than a height of a front side of the metallic member.

8. The semiconductor device according to claim 1, wherein the semiconductor element has a thickness of not less than 30 μm and not more than 150 μm.

9. The semiconductor device according to claim 1, wherein the metallic member has a thickness such that a flexural rigidity of the metallic member is equal to or greater than a flexural rigidity of the semiconductor element on which the metallic member is formed.

10. The semiconductor device according to claim 1, wherein an entire back side of the metallic member opposite to a front side of the metallic member joined to the back side of the back-side electrode is exposed from the resin member.

11. A method for manufacturing a semiconductor device comprising:
an electrode formation step to form a front-side electrode on a front side of a thin semiconductor wafer, and form a back-side electrode on a back side of the semiconductor wafer;
a metallic member formation step to form a metallic member on at least one of a front side of the front-side electrode and a back side of the back-side electrode;
a semiconductor element cutting step to cut the semiconductor wafer into individual semiconductor elements; and a resin member application step to apply a resin member so that the resin member is in contact with a lateral side of the metallic member and surrounds a periphery of the metallic member, with a part of the front side of the semiconductor element being exposed, wherein the metallic member is provided inside an outer circumference of the semiconductor element in a plan view.

12. The method for manufacturing a semiconductor device according to claim 11, further comprising:
    a semiconductor element placement step to place the front side of the front-side electrode on a protective sheet; and
    a semiconductor element detachment step to detach the semiconductor element from the protective sheet.

13. A semiconductor module comprising:
    the semiconductor device according to claim 1;
    an insulating substrate having the semiconductor device thereon;
    a sealing member sealing the semiconductor device and the insulating substrate; and
    a cooler joined to the insulating substrate.

14. The method for manufacturing a semiconductor device according to claim 11, wherein the resin member surrounds a periphery of the semiconductor element.

15. The method for manufacturing a semiconductor device according to claim 14, wherein the resin member is in contact with a lateral side of the semiconductor element and covers an outer periphery portion of at least one of the front side of the semiconductor element and the back side of the semiconductor element.

16. The method for manufacturing a semiconductor device according to claim 11, wherein
    a front side of the metallic member is in contact with the back side of the back-side electrode, and
    the metallic member is larger in area than the back-side electrode in a plan view.

17. The method for manufacturing a semiconductor device according to claim 15, wherein the resin member covers an outer periphery portion of at least one of the front side of the metallic member and a hack side of the metallic member.

18. The method for manufacturing a semiconductor device according to claim 15, wherein
    the metallic member is smaller in area than the back-side electrode in a plan view,
    a front side of the metallic member is in contact with the back side of the back-side electrode, and
    the resin member is in contact with the back side of the back-side electrode.

19. The semiconductor device according to claim 15, wherein
    a back side of the metallic member is in contact with the front side of the front-side electrode, and
    the resin member is higher or lower than a height of a front side of the metallic member.

20. The method for manufacturing a semiconductor device according to claim 11, wherein the semiconductor element has a thickness of not less than 30 μm and not more than 150 μm.

* * * * *